US012733273B2

(12) United States Patent
Lee et al.

(10) Patent No.: US 12,733,273 B2
(45) Date of Patent: Sep. 8, 2026

(54) IMAGE SENSOR

(71) Applicant: SAMSUNG ELECTRONICS CO., LTD., Suwon-si (KR)

(72) Inventors: Kyumin Lee, Seoul (KR); Seunghwi Yoo, Yongin-si (KR); Jueun Kim, Hwaseong-si (KR); Soojin Hong, Guri-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 908 days.

(21) Appl. No.: 18/074,042

(22) Filed: Dec. 2, 2022

(65) Prior Publication Data

US 2023/0207586 A1 Jun. 29, 2023

(30) Foreign Application Priority Data

Dec. 27, 2021 (KR) ........................ 10-2021-0188383

(51) Int. Cl.
*H10F 39/00* (2025.01)
*H10F 39/18* (2025.01)

(52) U.S. Cl.
CPC ..... *H10F 39/80373* (2025.01); *H10F 39/014* (2025.01); *H10F 39/182* (2025.01); *H10F 39/8053* (2025.01); *H10F 39/8063* (2025.01); *H10F 39/807* (2025.01); *H10F 39/811* (2025.01)

(58) Field of Classification Search
None
See application file for complete search history.

(56) References Cited

U.S. PATENT DOCUMENTS 8,026,171 B2 9/2011 Lee et al.
9,245,957 B2 1/2016 Kim et al.
9,343,534 B2 5/2016 Kim et al.
10,115,806 B2 10/2018 Kim et al.
11,063,081 B2 * 7/2021 Sze ........................ H10F 39/026
(Continued)

FOREIGN PATENT DOCUMENTS

KR 20070050511 A 5/2007
KR 20120066789 A 6/2012
(Continued)

OTHER PUBLICATIONS

Office Action in Korean Appln. No. KR 10-2021-0188383, mailed on Jul. 14, 2025, 13 pages (with English translation).

*Primary Examiner* — Benjamin P Sandvik
(74) *Attorney, Agent, or Firm* — Fish & Richardson P.C.

(57) ABSTRACT

An image sensor includes a pixel division structure, a light sensing element, a transistor, a color filter array layer, and a microlens. The pixel division structure extends through a substrate in a vertical direction substantially perpendicular to an upper surface of the substrate, and defines unit pixel regions in which unit pixels are respectively formed. The light sensing element is formed in each of the unit pixel regions. The transistor is formed on the substrate. The color filter array layer is formed under the substrate, and includes color filters. The microlens is formed under the color filter array layer. The transistor includes a gate structure on an active fin protruding from the upper surface of the substrate and source/drain regions at portions of the active fin adjacent to the gate structure.

20 Claims, 27 Drawing Sheets

(56) References Cited

U.S. PATENT DOCUMENTS

| | | | | |
|---|---|---|---|---|
| 11,450,696 | B1 * | 9/2022 | Zang | H10F 39/80373 |
| 11,462,577 | B2 | 10/2022 | Lee et al. | |
| 11,670,661 | B2 | 6/2023 | Kim et al. | |
| 2021/0017526 | A1 | 1/2021 | Xu et al. | |
| 2021/0210532 | A1 * | 7/2021 | Hung | H10F 39/182 |
| 2021/0210534 | A1 * | 7/2021 | Chen | H10F 39/18 |
| 2021/0242270 | A1 * | 8/2021 | Lim | H10F 39/80373 |
| 2021/0366956 | A1 * | 11/2021 | Wu | H10F 39/811 |
| 2022/0375977 | A1 * | 11/2022 | Zang | H10F 39/802 |
| 2022/0376069 | A1 * | 11/2022 | Zang | H10D 30/668 |

FOREIGN PATENT DOCUMENTS

| | | | |
|---|---|---|---|
| KR | 2144992 | A | 6/2014 |
| KR | 10-2017-0014697 | A | 2/2017 |
| KR | 10-2021-0070573 | A | 6/2021 |
| KR | 10-2021-0081217 | A | 7/2021 |
| WO | WO 2020 262502 | A1 | 12/2020 |

* cited by examiner 140
130
120
170
180
190
160
100
150
115
115
150
160

710
700
650
640
630
620
610
660
305
450
525
510
505
C'
755 750
730
740 745
160
420 430
402 412
760
715
705
725
210
240
290
300
250
320
390
404
414
440
502
C
504
IV
III
II
I
D1
D2
D3

710
700
650
640
630
620
610
660
305
450
525
510
510
510
505
C'
755 750
730
740 745
777 160
420
430
776
780
774
772
412
402
IV
III
II
I
760
715
705
725
210
240
290
300
250
320
390
404
414
440
502
C
504
D1
D2
D3

IMAGE SENSOR

CROSS-REFERENCE TO RELATED APPLICATION

A claim of priority under 35 USC § 119 is made to Korean Patent Application No. 10-2021-0188383, filed on Dec. 27, 2021 in the Korean Intellectual Property Office (KIPO), the entirety of which is hereby incorporated by reference.

BACKGROUND

The present disclosure relates to image sensors.

Image sensors may include various types of transistors. As the integration degree of the image sensor increases, there is need to form transistors having improved electrical characteristics.

SUMMARY

Embodiments of the inventive concepts provide an image sensor including a pixel division structure, a light sensing element, a transistor, a color filter array layer, and a microlens. The pixel division structure may extend through a substrate in a vertical direction substantially perpendicular to an upper surface of the substrate, and may define unit pixel regions in which unit pixels are respectively formed. The light sensing element may be formed in each of the unit pixel regions. The transistor may be formed on the substrate. The color filter array layer may be formed under the substrate, and may include color filters. The microlens may be formed under the color filter array layer. The transistor may include a gate structure on an active fin protruding from the upper surface of the substrate, and source/drain regions at portions of the active fin adjacent to the gate structure.

Embodiments of the inventive concepts further provide an image sensor including a pixel division structure, a light sensing element, a transistor, a color filter array layer, and a microlens. The pixel division structure may extend through a substrate in a vertical direction substantially perpendicular to an upper surface of the substrate, and may define unit pixel regions in which unit pixels are respectively formed. The light sensing element may be formed in each of the unit pixel regions. The transistor may be formed on the substrate. The color filter array layer may be formed under the substrate, and may include color filters. The microlens may be formed under the color filter array layer. The transistor may include a gate structure on the substrate, and source/drain regions at portions of the substrate adjacent to the gate structure. A silicon-fluorine layer may be formed at an upper portion of the substrate under the gate structure.

Embodiments of the inventive concepts still further provides an image sensor including a first substrate, a first insulating interlayer on the first substrate and containing first wirings, a second insulating interlayer on the first insulating interlayer and containing second wirings, a second substrate on the second insulating interlayer, a pixel division structure in the second substrate and defining unit pixel regions in which unit pixels are respectively formed, a light sensing element in each of the unit pixel regions of the second substrate, a first gate structure extending through a lower portion of the second substrate and contacting the light sensing element, a floating diffusion (FD) region at the lower portion of the second substrate adjacent to the first gate structure, a second gate structure under an active fin protruding from a lower surface of the second substrate downwardly, a lower planarization layer on the second substrate, a color filter array layer on the second substrate and including color filters, and a microlens on the color filter array layer.

In the method of manufacturing the image sensor in accordance with example embodiments, an upper portion of a substrate may be etched to form an active fin, and a surface of the active fin damaged by the etching process may be cured by a fluorine ion implantation process. Thus, the finFET on the active fin may have improved electrical characteristics.

BRIEF DESCRIPTION OF THE DRAWINGS

The foregoing and other features of the inventive concepts will be described in detail with reference to the accompanying drawings in which like reference characteristics refer to like parts throughout the different views.

FIGS. 2, 3, 4, 5, 6, 7, 8, 9, 10 and 11 illustrate cross-sectional views of a method of forming a pixel of an image sensor shown in FIG. 1 in accordance with embodiments of the inventive concepts.

FIG. 17 illustrates a cross-sectional view of a pixel included in an image sensor in accordance with embodiments of the inventive concepts.

DESCRIPTION

Figure 1:
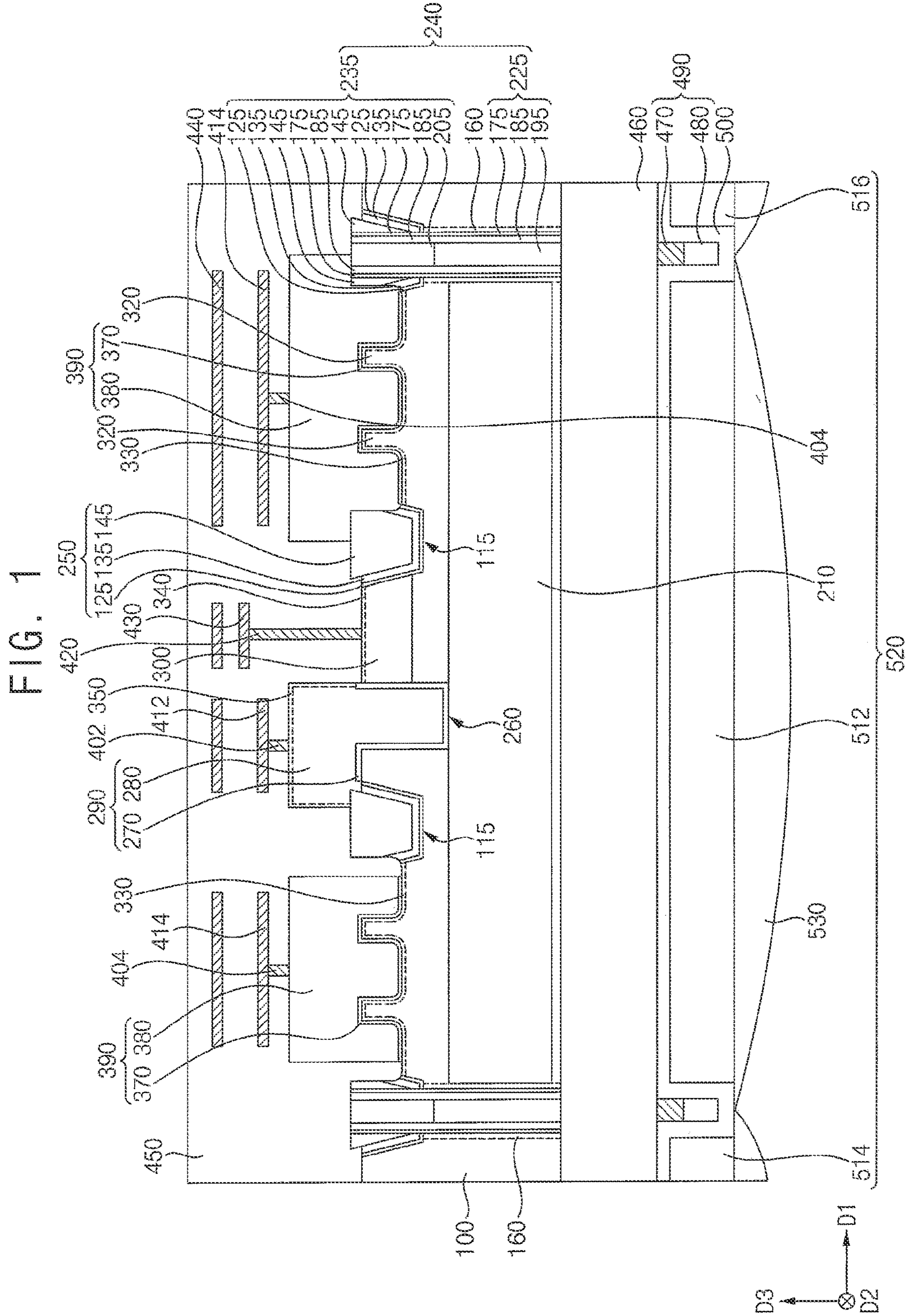
FIG. 1 illustrates a cross-sectional view of a pixel included in an image sensor in accordance with embodiments of the inventive concepts.

Image sensors and methods of manufacturing the same in accordance with example embodiments will be more clearly understood from the following detailed description taken in conjunction with the accompanying drawings.

In the following description, first to fourth regions I, II, III and IV may refer to only an inside of a reference substrate, a first substrate and/or a second substrate. Alternatively, the first to fourth regions I, II, III and IV may also refer to spaces over and under the reference substrate, the first substrate and/or the second substrate. Moreover, a direction substantially parallel to the reference substrate or the first substrate and/or the second substrate may be referred to as a horizontal direction, and a direction substantially perpendicular to the surface of the reference substrate or the first substrate and/or the second substrate may be referred to as a vertical direction. In the following description, the terminology up vs. down, on and over vs. beneath and under, upper surface vs. lower surface, and upper portion vs. lower portion are relative conceptions so as to describe opposite sides in the vertical direction. These terms are for descriptive purposes, and are intended only to describe the relative locations of components assuming the orientation of the overall device is the same as shown in the drawings. The embodiments however should not be limited to the illustrated device orientations.

FIG. 1 illustrates a plan view of a pixel included in an image sensor in accordance with embodiments of the inventive concepts.

Referring to FIG. 1, the image sensor may include a pixel division structure 240 extending through a substrate 100 in a vertical direction, and having a lattice shape in a plan view.

In example embodiments, the substrate 100 may include silicon, germanium, silicon-germanium, or a III-V group compound semiconductor such as GaP, GaAs, or GaSb. In example embodiments, a p-type well doped with p-type impurities may be formed partially or entirely in the substrate 100.

Unit pixel regions in which unit pixels are formed, respectively, may be defined by the pixel division structure 240 in the substrate 100. In example embodiments, the unit pixels may be arranged in the horizontal direction to form a pixel array.

In example embodiments, the pixel division structure 240 may include a second filling pattern structure 225 and a first filling pattern structure 235 stacked in the vertical direction. The second filling pattern structure 225 may include a core extending in the vertical direction and a lower portion of a lateral pattern structure covering a sidewall of the core.

In example embodiments, the core may include a second filling pattern 195, and the lateral pattern structure may include a first lateral pattern 175 and a second lateral pattern 185.

In example embodiments, the second filling pattern 195 may include doped or undoped polysilicon.

A lower portion of the second lateral pattern 185 may cover the sidewall of the core, and a lower portion of the first lateral pattern 175 may cover a sidewall of the lower portion of the second lateral pattern 185. The first lateral pattern 175 may include an oxide, e.g., silicon oxide, and the second lateral pattern 185 may include a nitride, e.g., silicon nitride.

The first filling pattern structure 235 may include a third filling pattern 205 on the core, upper portions of the first and second lateral patterns 175 and 185 on a sidewall of the third filling pattern 205, a first filling pattern 145 covering an outer sidewall of the upper portion of the first lateral pattern 175, and first and second pads 125 and 135 covering an outer sidewall of the first filling pattern 145.

The third filling pattern 205 may include an oxide, e.g., silicon oxide.

The lower portions of the first and second lateral patterns 175 and 185 may be included in the second filling pattern structure 225, and the upper portions of the first and second lateral patterns 175 and 185 may be included in the first filling pattern structure 235. The lower portions and the upper portions of the first and second lateral patterns 175 and 185 may be connected to each other and integrally formed.

The first filling pattern 145 may include an oxide, e.g., silicon oxide. The first pad 125 may include an oxide, e.g., silicon oxide, and the second pad 135 may include a nitride, e.g., silicon nitride.

In example embodiments, a width of the first filling pattern structure 235 may be greater than a width of the second filling pattern structure 225.

An impurity region 160 may be formed at a portion of the substrate 100 adjacent to the pixel division structure 240, and may be doped with p-type impurities, e.g., boron.

An isolation structure 250 may be formed in each pixel region, and may include the first filling pattern 145, and the first and second pads 125 and 135 on the sidewall and a bottom surface of the first filling pattern 145, within second trench 115.

The image sensor may include a light sensing element 210 in each unit pixel region in the substrate 100. In example embodiments, the light sensing element 210 may be an impurity region doped with n-type impurities, e.g., phosphorus (P), and may be a portion of a photodiode (PD). That is, the p-type well and the light sensing element 210 doped with n-type impurities in the substrate 100 may form PN junction, which may be the PD.

The image sensor may include a first gate structure 290 in a fourth trench 260 extending through an upper portion of the substrate 100 and contacting an upper surface of the light sensing element 210. The first gate structure 290 may include a first gate insulation pattern 270 and a first gate electrode 280. The first gate insulation pattern 270 may include an oxide, e.g., silicon oxide, and the first gate electrode 280 may include, e.g., doped polysilicon. Alternatively, the first gate electrode 280 may include a metal, a metal nitride, a metal silicide, etc.

The image sensor may include a floating diffusion (1-D) region 300 at an upper portion of the substrate 100 contacting the first gate structure 290. The FD region 300 may be an impurity region doped with n-type impurities, e.g., phosphorus (P).

The first gate structure 290, the light sensing element 210 and the FD region 300 may form a transfer transistor, and the first gate structure 290 may also be referred to as a transfer gate (TG).

An active pattern 320 may protrude from an upper surface of the substrate 100, and may also be referred to as an active fin. In example embodiments, the active pattern 320 may extend in a first direction (i.e., into the figure), and a plurality of active patterns 320 may be formed to be spaced apart from each other in a second direction (i.e., a horizontal left-right direction in the figure) perpendicular to the first direction.

A second gate structure 390 may be formed on the active pattern 320. The second gate structure 390 may include a second gate insulation pattern 370 and a second gate electrode 380. The second gate insulation pattern 370 may include an oxide, e.g., silicon oxide, and the second gate electrode 380 may include, e.g., doped polysilicon. Alternatively, the second gate electrode 380 may include, e.g., a metal, a metal nitride, a metal silicide, etc.

In example embodiments, the second gate structure 390 may extend in the second direction to a given length, and thus may be formed on one or more active patterns 320 in the second direction.

Source/drain regions may be formed in portions of the active pattern 320 adjacent to the second gate structure 390, that is, in portions of the active pattern 320 at opposite sides of the second gate structure 390. Thus, the second gate structure 390 and the source/drain regions may form a transistor. The second gate structure 390 may be formed on the active fin 320, and thus the transistor may be a finFET.

In example embodiments, a first silicon-fluorine layer 330 may be formed at a surface of the active pattern 320 under the second gate structure 390. The first silicon-fluorine layer 330 may include Si-F bond and Si-Si bond.

In example embodiments, a second silicon-fluorine layer 340 may be formed at an upper portion of the FD region 300, and a third silicon-fluorine layer 350 may be formed at a surface of the first gate electrode 280 included in the first gate structure 290. Alternatively, the second and third silicon-fluorine layers 340 and 350 may not be formed.

The image sensor may include an insulating interlayer 450 containing first to third vias 402, 404 and 420 and first to fourth wirings 412, 414, 430 and 440.

The first to third vias 402, 404 and 420 may be connected to the first gate structure 290, the second gate structure 390 and the FD region 300, respectively, and the first to third wirings 412, 414 and 430 may be connected to the first, second and third vias 402, 404 and 420, respectively. The fourth wirings 440 may be formed above the third wirings 430.

The image sensor may include a planarization layer 460 contacting a bottom surface of the substrate 100, and may include an interference blocking structure 490 under the planarization layer that may overlap the pixel division structure 240 in the vertical direction.

The planarization layer 460 may include a single layer, or may have a multi-layered structure including a plurality of layers sequentially stacked in the vertical direction. The planarization layer 460 may include, e.g., silicon oxide, silicon nitride, or a metal oxide such as aluminum oxide or hafnium oxide.

The interference blocking structure 490 may serve as a barrier that may block light incident onto one pixel from moving to a neighboring pixel, so that light interference between neighboring pixels may be prevented. In example embodiments, the interference blocking structure 490 may include first and second interference blocking patterns 470 and 480 stacked in the vertical direction. The first interference blocking pattern 470 may include a metal nitride, e.g., titanium nitride, tantalum nitride, etc., and the second interference blocking pattern 480 may include a metal, e.g., tungsten. Alternatively, the second interference blocking pattern 480 may include a low refractive index material (LRIM), e.g., porous silicon oxide.

A protection layer 500 may be formed on a lower surface and a sidewall of the interference blocking structure 490, and on a lower surface of the planarization layer 460. The protection layer 500 may include a metal oxide, e.g., aluminum oxide.

The image sensor may include a color filter array layer 520 that may include a plurality of color filters divided from each other by an interference blocking structure 490. In example embodiments, the color filter array layer 520 may include a plurality of color filters, e.g., a first color filter 512, a second color filter 514 and a third color filter 516.

The first to third color filters 512, 514 and 516 may be arranged in the horizontal direction under the planarization layer 460 to form a color filter array. In example embodiments, the first to third color filters 512, 514 and 516 may be a green filter G, a blue filter B and a red filter R, respectively, however, the inventive concepts are not limited thereto.

The image sensor may include a plurality of microlenses 530 under the color filter array layer 520 and the protection layer 500. In example embodiments, each of the microlenses 530 may be disposed under a corresponding one of the first to third color filters 512, 514 and 516 included in each pixel. Alternatively, each of the microlenses 530 may be commonly disposed on corresponding ones of the first to third color filters 512, 514 and 516 included in neighboring pixels, respectively, e.g., ones of the first to third color filters 512, 514 and 516 that may filter the same color.

As illustrated above, transistors included in the image sensor may be finFETs, and thus may have enhanced electrical characteristics when compared to a planar transistor.

FIGS. 2 to 11 illustrate cross-sectional views of a method of forming a pixel of an image sensor shown in FIG. 1 in accordance with embodiments of the inventive concepts.

Figure 2:
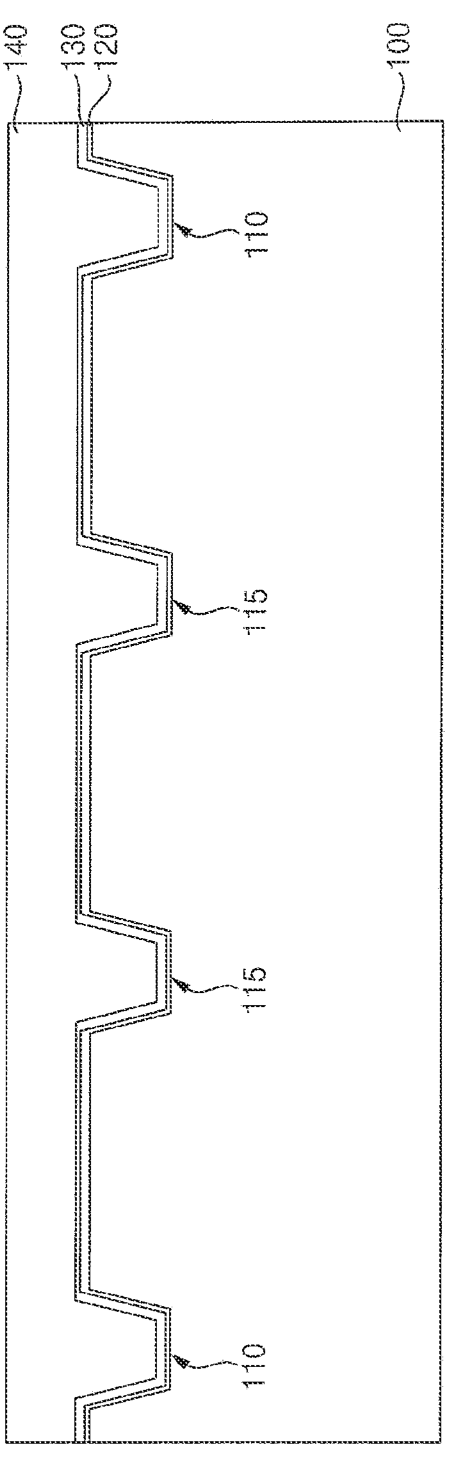

Referring to FIG. 2, an upper portion of a substrate 100 may be removed to form first and second trenches 110 and 115, and a first pad layer 120, a second pad layer 130 and a first filling layer 140 may be sequentially stacked on the substrate 100 having the first and second trenches 110 and 115 thereon.

In example embodiments, the first trench 110 may have a lattice pattern in plan view. The second trenches 115 may be formed in a region surrounded by the first trenches 110, that is, in a unit pixel region.

Figure 3:
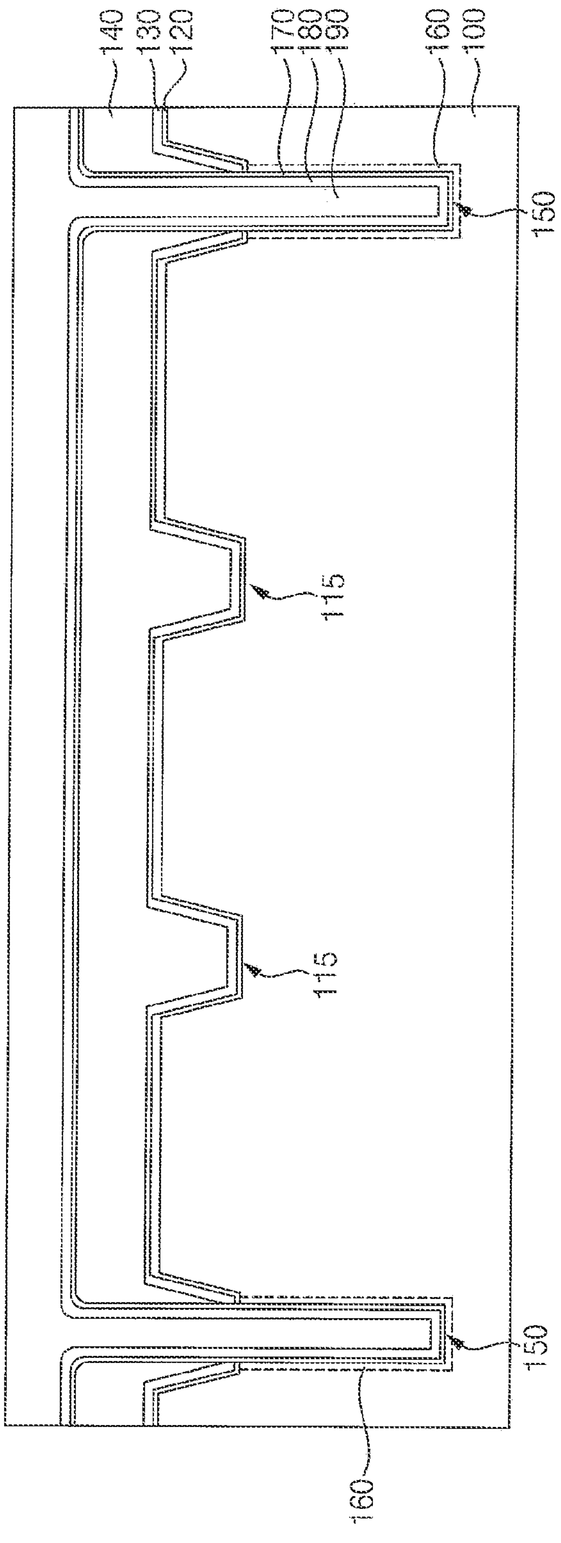

Referring to FIG. 3, the first filling layer 140, the second pad layer 130, the first pad layer 120 and the substrate 100 may be sequentially etched to form a third trench 150.

The etching process may be, e.g., a dry etching process, and thus may be performed with an etching mask on the first filling layer 140.

In example embodiments, the third trench 150 may overlap the first trench 110 in the vertical direction. The third trench 150 may have a width smaller than a width of the first trench 110 and a depth greater than a depth of the first trench 110.

P-type impurities, e.g., boron may be implanted into a portion of the substrate 100 adjacent to the third trench 150 to form an impurity region 160.

A lateral layer structure may be formed on an inner wall of the third trench 150 and an upper surface of the first filling layer 140.

In example embodiments, the lateral layer structure may include first and second lateral layers 170 and 180 sequentially stacked and including different materials. The first lateral layer 170 may include an oxide, e.g., silicon oxide, and the second lateral layer 180 may include a nitride, e.g., silicon nitride, silicon carbonitride, silicon oxycarbonitride, etc. FIG. 3 shows the second lateral layer 180 includes a single layer, however, the inventive concepts are not limited thereto, and second lateral layer 180 may have a multi-layered structure including a plurality of layers sequentially stacked and including some of the above materials, respectively.

A second filling layer 190 may be formed on the lateral layer structure to fill the third trench 150.

In example embodiments, the second filling layer 190 may include doped or undoped polysilicon.

Figure 4:
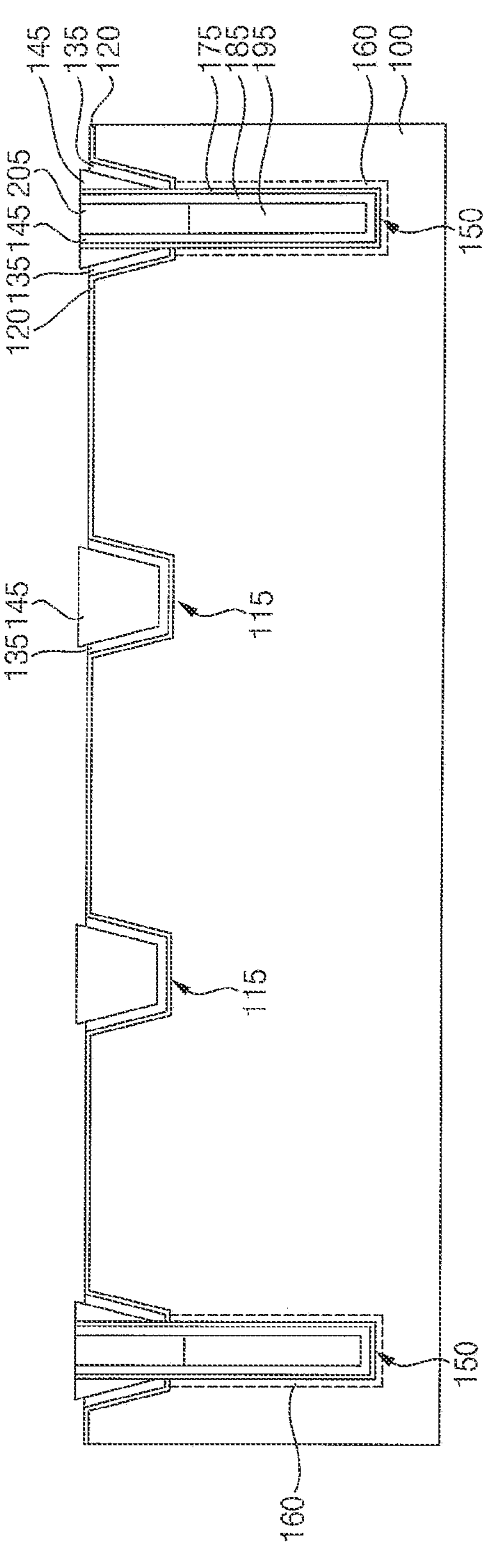

Referring to FIG. 4, for example, an etch back process may be performed to remove an upper portion of the second filling layer 190, and thus a second filling pattern 195 may remain in a lower portion of the third trench 150.

A third filling layer may be formed on the second filling pattern 195 and the second lateral layer 180 to fill an upper portion of the third trench 150, and upper portions of the third filling layer, the first and second lateral layers 170 and 180 and the first filling layer 140 may be planarized.

In example embodiments, the planarization process may include a chemical mechanical polishing (CMP) process and/or an etch back process.

By the planarization process, the third filling layer may be transformed into a third filling pattern 205, the first and second lateral layers 170 and 180 may be transformed into first and second lateral patterns 175 and 185, respectively, and the first filling layer 140 may be transformed into a first filling pattern 145. The first and second lateral patterns 175 and 185 may form a lateral pattern structure.

The exposed second pad layer 130 may be partially removed to form a second pad 135, and thus an upper surface of the first pad layer 120 may be partially exposed.

The second pad layer 130 may be removed by, e.g., a wet etching process.

Figure 5:
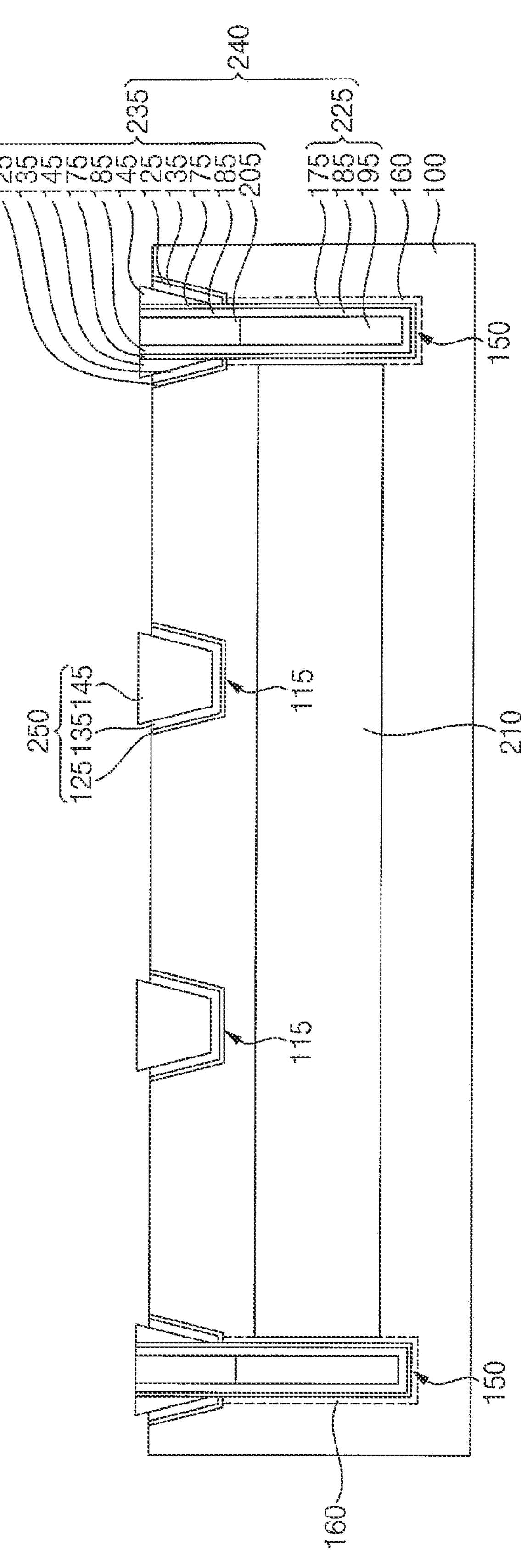

Referring to FIG. 5, for example, an ion implantation process may be performed to form a light sensing element 210 in the substrate 100, and the exposed portion of the first pad layer 120 may be removed. Thus, the first pad layer 120 may remain as a first pad 125, and an upper surface of the substrate 100 may be exposed.

By the ion implantation process, n-type impurities, e.g., phosphorus (P) may be doped into the substrate 100, and the thus light sensing element 210 may include silicon doped with n-type impurities.

Hereinafter, the third filling pattern 205, upper portions of the first and second lateral patterns 175 and 185 on a sidewall of the third filling pattern 205, the first filling pattern 145 and the first and second pads 125 and 135 may be referred to as a first filling pattern structure 235. The core including the second filling pattern 195, lower portions of the first and second lateral patterns 175 and 185 covering a sidewall and a lower surface of the core, that is, a lower portion of the lateral pattern structure may be referred to as a second filling pattern structure 225.

The second filling pattern structure 225 and the first filling pattern structure 235 sequentially stacked in the vertical direction may be referred to as a pixel division structure 240. The first and second pads 125 and 135, and the first filling pattern 145 in the second trench 115 may be referred to as an isolation structure 250.

Figure 6:
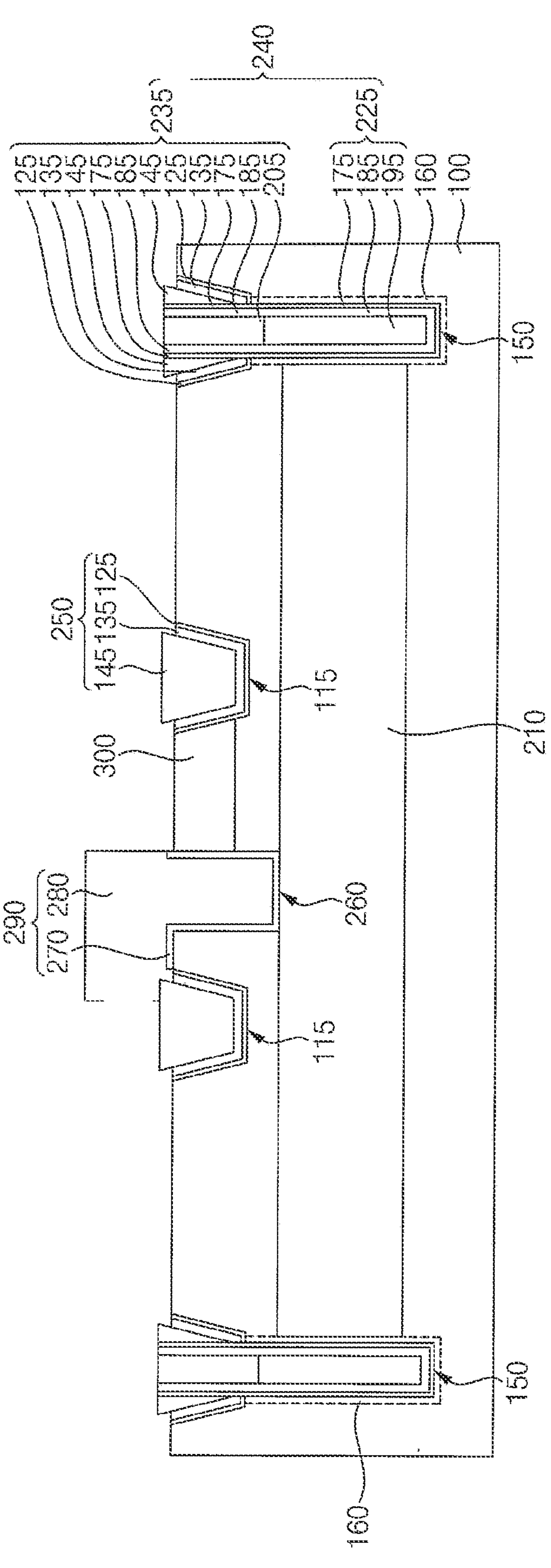

Referring to FIG. 6, an upper portion of the substrate 100 may be removed to form a fourth trench 260 exposing an upper surface of the light sensing element 210, and for example, a thermal oxidation process may be performed to form a first gate insulation layer.

The first gate insulation layer may be formed on the upper surface of the light sensing element 210, a sidewall of the substrate 100 exposed by the fourth trench 260 and the upper surface of the substrate 100, and may include, e.g., silicon oxide.

A first gate electrode layer may be formed on the first gate insulation layer, and the first gate electrode layer and the first gate insulation layer may be patterned to form a first gate electrode 280 and a first gate insulation pattern 270, respectively. The first gate insulation pattern 270 and the first gate electrode 280 may form a first gate structure 290, which may be referred to as a transfer gate (TG).

N-type impurities, e.g., phosphorus may be doped into an upper portion of the substrate 100 adjacent to the first gate structure 290 to form a floating diffusion (FD) region 300.

The first gate structure 290, the light sensing element 210 and the FD region 300 may form a transfer transistor.

Figure 7:
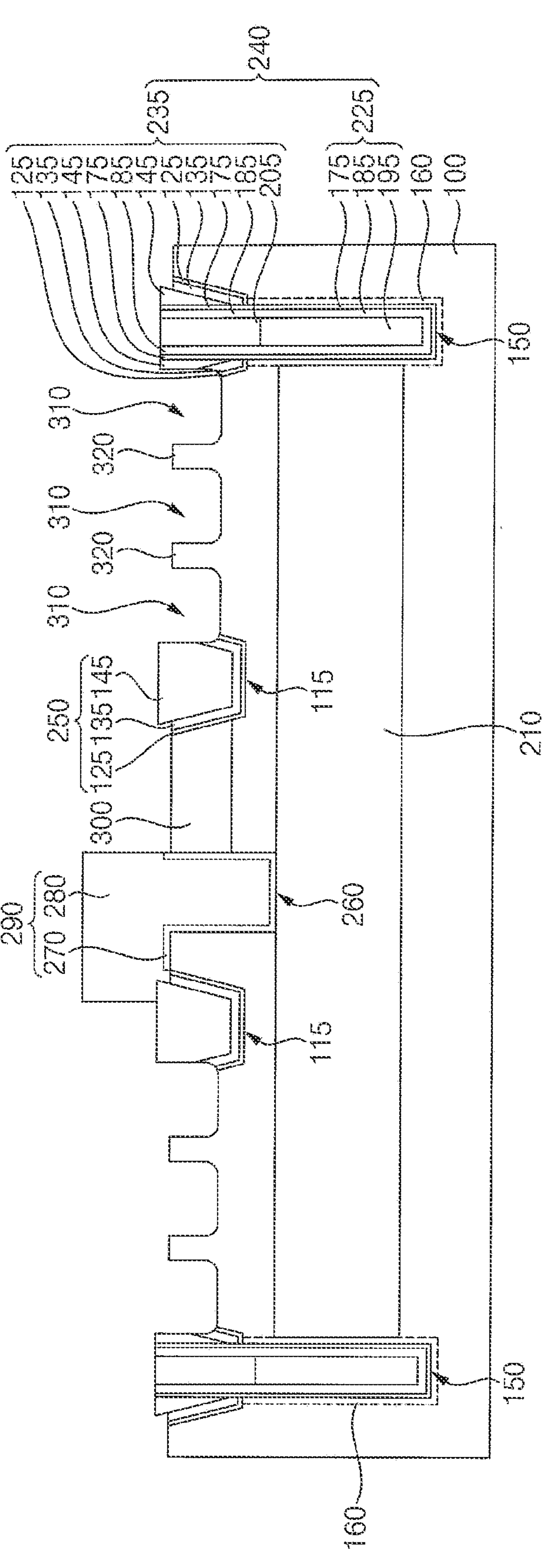

Referring to FIG. 7, an upper portion of the substrate 100 may be partially removed by an etching process to form a fifth trench 310, and thus an active pattern 320 may be formed on the substrate 100. The active pattern 320 may protrude from the upper surface of the substrate 100, and thus may be referred to as an active fin.

In example embodiments, the fifth trench 310 may extend in a first direction, and a plurality of fifth trenches 310 may be spaced apart from each other in a second direction substantially perpendicular to the first direction. Thus, the active pattern 320 may extend in the first direction, and a plurality of active patterns 320 may be spaced apart from each other in the second direction.

During the etching process for forming the fifth trench 310, an upper portion of the substrate 100 and a surface of the active pattern 320 including silicon may be damaged, so that bonding of silicon atoms may be unstable.

Figure 8:
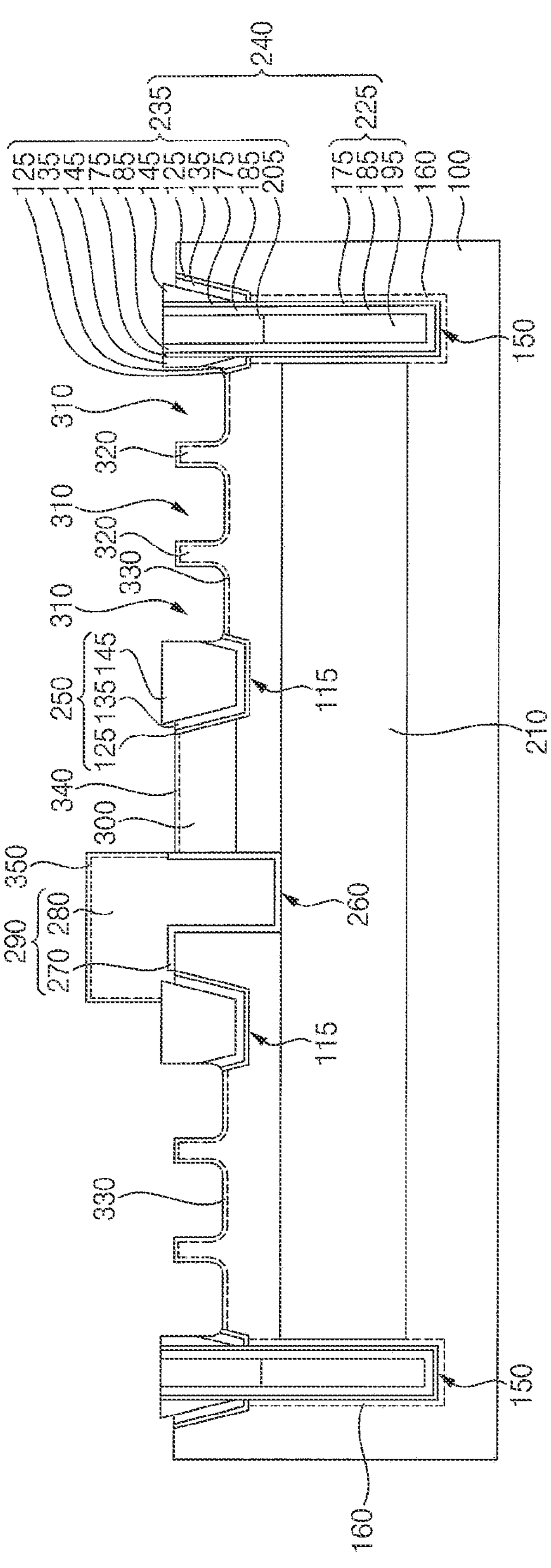

Referring to FIG. 8, an ion implantation process may be performed so that n-type ions, e.g., fluorine ions may be implanted into the upper portion of the substrate 100 and the surface of the active pattern 320.

By the ion implantation process, silicon included in the upper portion of the substrate 100 and the surface of the active pattern 320 may be bonded with fluorine to form silicon-fluorine bonds, and thus unstable bonding of silicon atoms may decrease. That is, the upper portion of the substrate 100 and the surface of the active pattern 320 damaged by the etching process may be cured by the ion implantation process.

The silicon-fluorine bonds in the upper portion of the substrate 100 and the surface of the active pattern 320 may form a first silicon-fluorine layer 330. During the ion implantation process, second and third silicon-fluorine layers 340 and 350 may be formed at surfaces of the FD region 300 and the first gate electrode 280, respectively.

Alternatively, the FD region 300 and the first gate electrode 280 may be covered by an ion implantation mask, so that the second and third silicon-fluorine layers 340 and 350 may not be formed.

Figure 9:
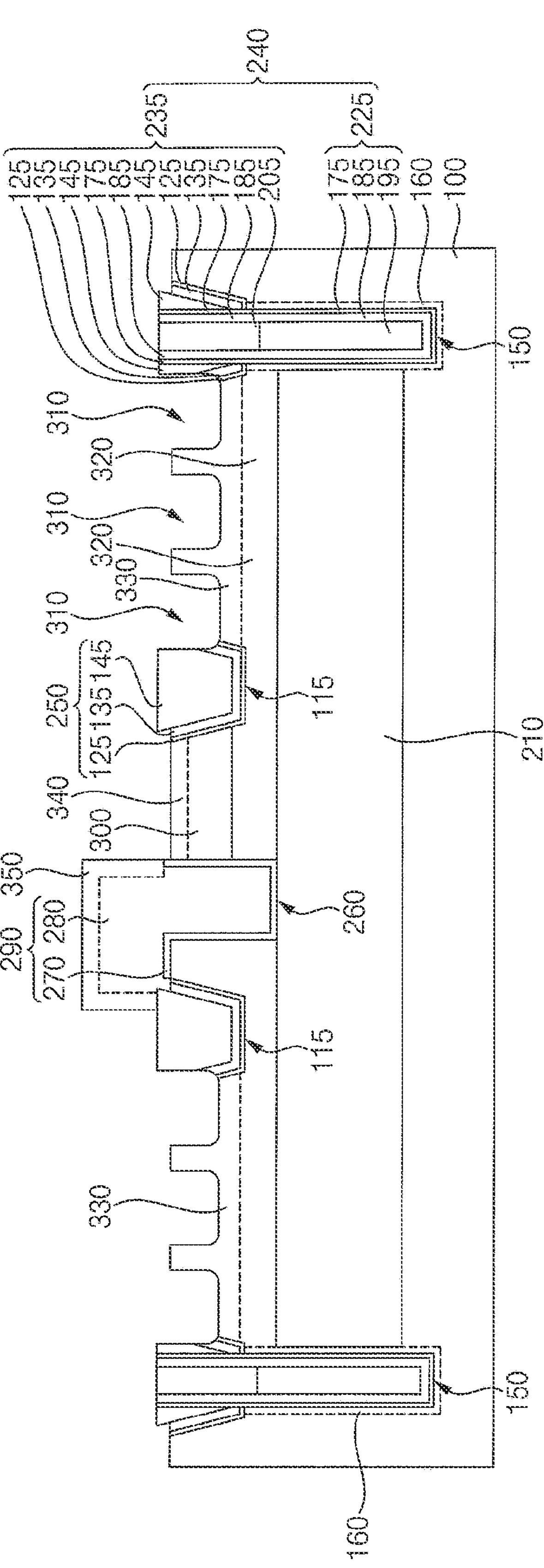

Referring to FIG. 9, an area of the first to third silicon-fluorine layers 330, 340 and 350 may be made greater than an area shown in FIG. 8 due to an amount of implanted ions during the ion implantation process and a process time of the ion implantation process.

Figure 10:
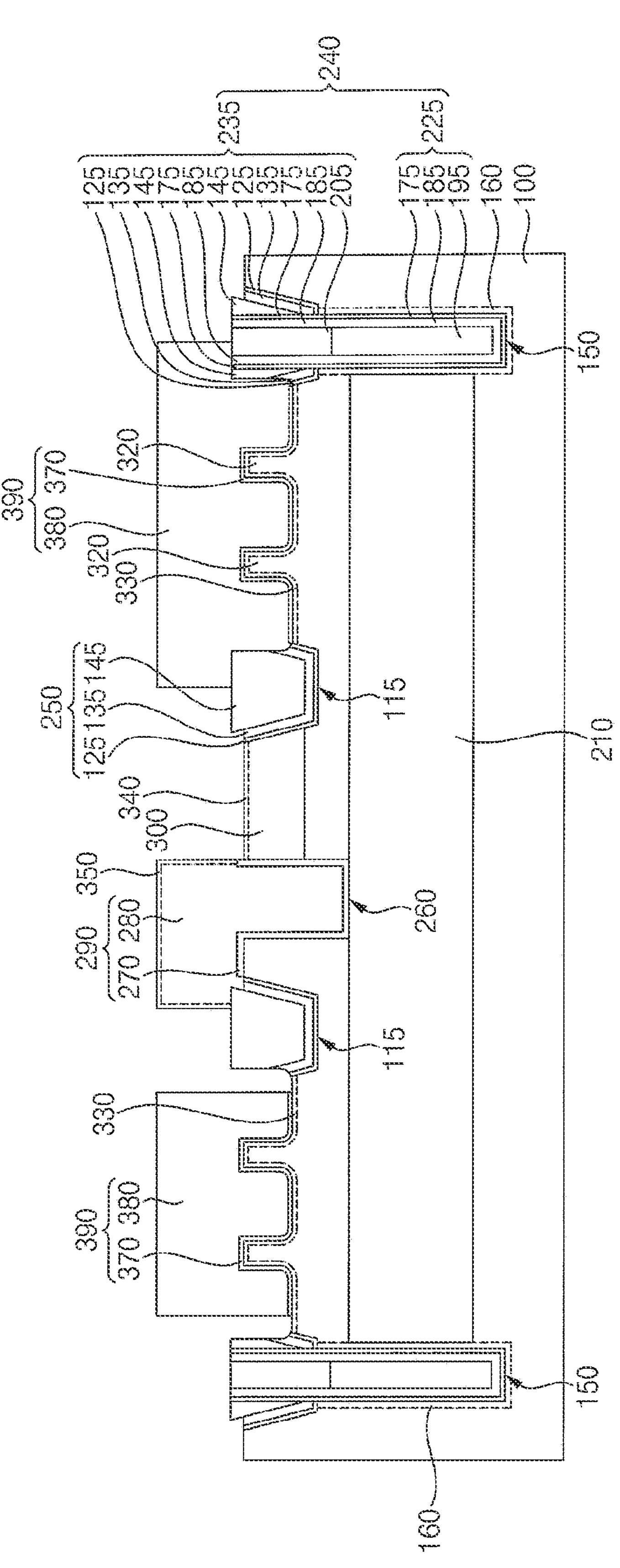

Referring to FIG. 10, for example, a thermal oxidation process may be performed to form a second gate insulation layer.

The second gate insulation layer may be formed on the upper surface of the substrate 100, the surface of the active pattern 320, the upper surface of the FD region 300 and the surface of the first gate structure 290, and may include, e.g., silicon oxide.

A second gate electrode layer may be formed on the second gate insulation layer, and the second gate electrode layer and the second gate insulation layer may be patterned to form a second gate electrode 380 and the second gate insulation pattern 370, respectively. The second gate insulation pattern 370 and the second gate electrode 380 may form a second gate structure 390.

In example embodiments, the second gate structure 390 may extend in the second direction to a given length, and may be formed on one or more active patterns 320 disposed in the second direction.

Impurities may be doped into portions of the active pattern 320 adjacent to the second gate structure 390 to form source/drain regions (not shown). That is, the source/drain regions may be formed in portions of the active pattern 320 at opposite sides of the second gate structure 390 in the first direction. The source/drain regions may be formed by doping n-type impurities, e.g., phosphorus.

The second gate structure 390 and the source/drain regions may form a transistor, and may serve as one of a reset transistor, a source follower transistor and a select transistor.

Figure 11:
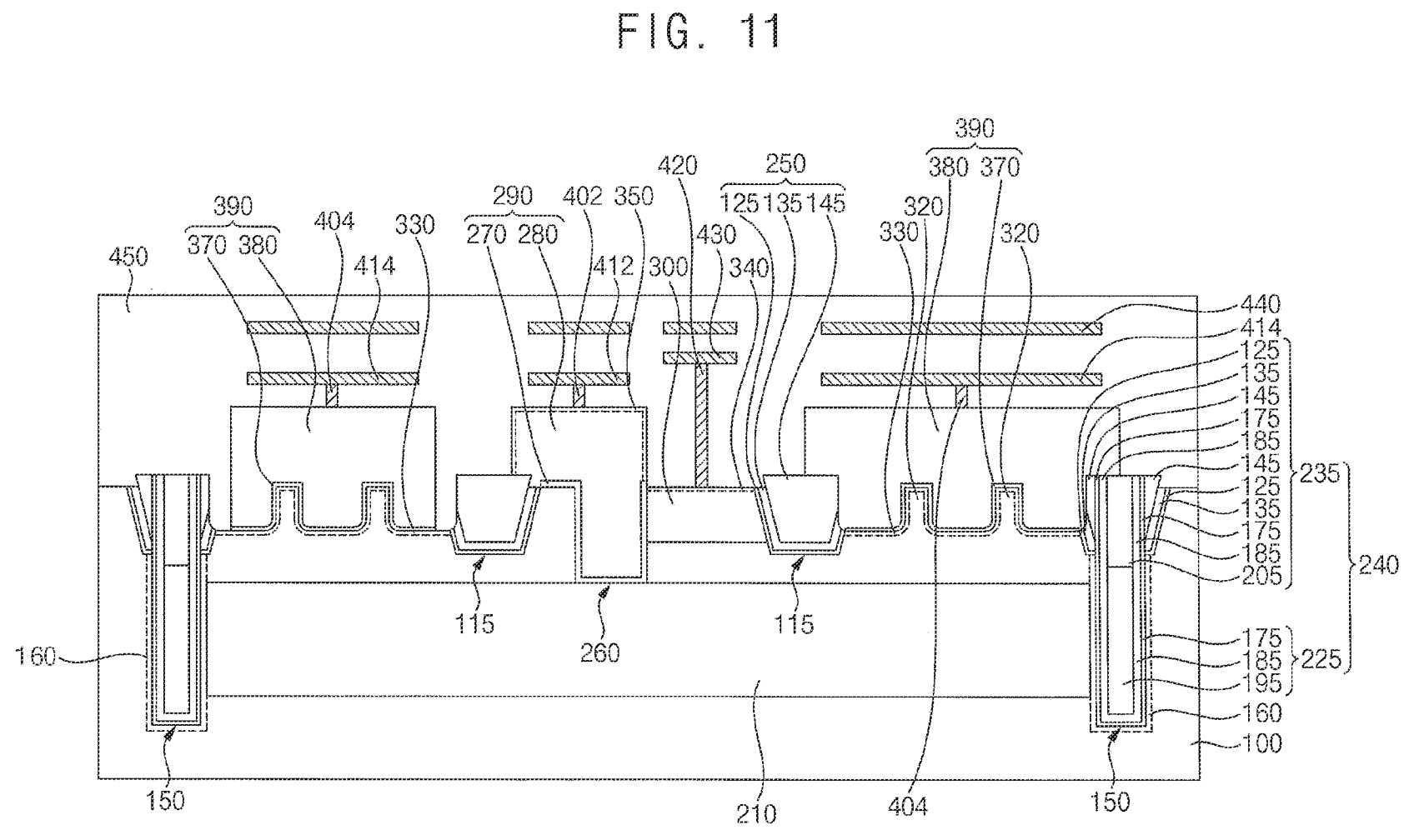

Referring to FIG. 11, vias and wirings may be formed to be electrically connected to the first and second gate structures 290 and 390 and the FD region 300.

Particularly, first, second and third vias 402, 404 and 420 connected to the first gate structure 290, the second gate structure 390 and the FD region 300, respectively, and first, second and third wirings 412, 414 and 430 connected to the first, second and third vias 402, 404 and 420, respectively, may be formed. Fourth wirings 440 may be further formed above the first to third wirings 412, 414 and 430.

The first to third vias 402, 404 and 420 and the first to fourth wirings 412, 414, 430 and 440 may be formed by, e.g., a single damascene process, a dual damascene process or a patterning process.

An insulating interlayer 450 may be formed to cover the first to third vias 402, 404 and 420 and the first to fourth wirings 412, 414, 430 and 440.

Referring to FIG. 1 again, a lower portion of the substrate 100 may be removed by, e.g., a grinding process and/or a CMP process. Thus, a lower portion of the second filling pattern structure 225 included in the pixel division structure 240 may be removed.

That is, lower portions of the core and the lateral pattern structure included in the second filling pattern structure 225 may be removed, and the pixel division structure 240 may extend through the substrate 100.

A planarization layer 460 may be formed on a lower surface of the substrate 100. An interference blocking structure 490 may be formed under the planarization layer 460 at a place overlapping the pixel division structure 240 in the substrate 100 in the vertical direction, and a protection layer 500 may be formed on a lower surface of the planarization layer 460 to cover the interference blocking structure 490.

A color filter array layer 520 including a plurality of color filters disposed in areas divided by the interference blocking structure 490 may be formed. In example embodiments, the color filter array layer 520 may include a first color filter 512, a second color filter 514 and a third color filter 516.

The first to third color filters 512, 514 and 516 may be spaced apart from each other under the planarization layer 460.

In example embodiments, the interference blocking structure 490 may include first and second interference blocking patterns 470 and 480 stacked in the vertical direction.

A plurality of microlenses 530 may be formed under the color filter array layer 520 and the protection layer 500. In example embodiments, each of the microlenses 530 may be disposed under a corresponding one of the first to third color filters 512, 514 and 516 included in each pixel. Alternatively, each of the microlenses 530 may be commonly disposed on corresponding ones of the first to third color filters 512, 514 and 516 included in neighboring pixels, respectively, e.g., ones of the first to third color filters 512, 514 and 516 that may filter the same color.

The pixel of the image sensor may be formed by the above processes.

As described, the second gate structure 390 may be formed by removing the upper portion of the substrate 100 to form the fifth trenches 310 and the active pattern 320 protruding from the substrate 100 (e.g., see FIG. 7), performing the fluorine ion implantation process on the surface of the active pattern 320 damaged by the etching process to cure the damaged surface of the active pattern 320 (e.g., see FIG. 8), thermally oxidizing the surface of the active pattern 320 to form the second gate insulation pattern 370, and forming the second gate electrode 380 on the second gate insulation pattern 370 (e.g., see FIG. 10).

Thus, the transistor including the second gate structure 390 and the source/drain regions may be finFETs on the active pattern 320, and may have improved electrical characteristics when compared to a planar transistor.

Figure 12:
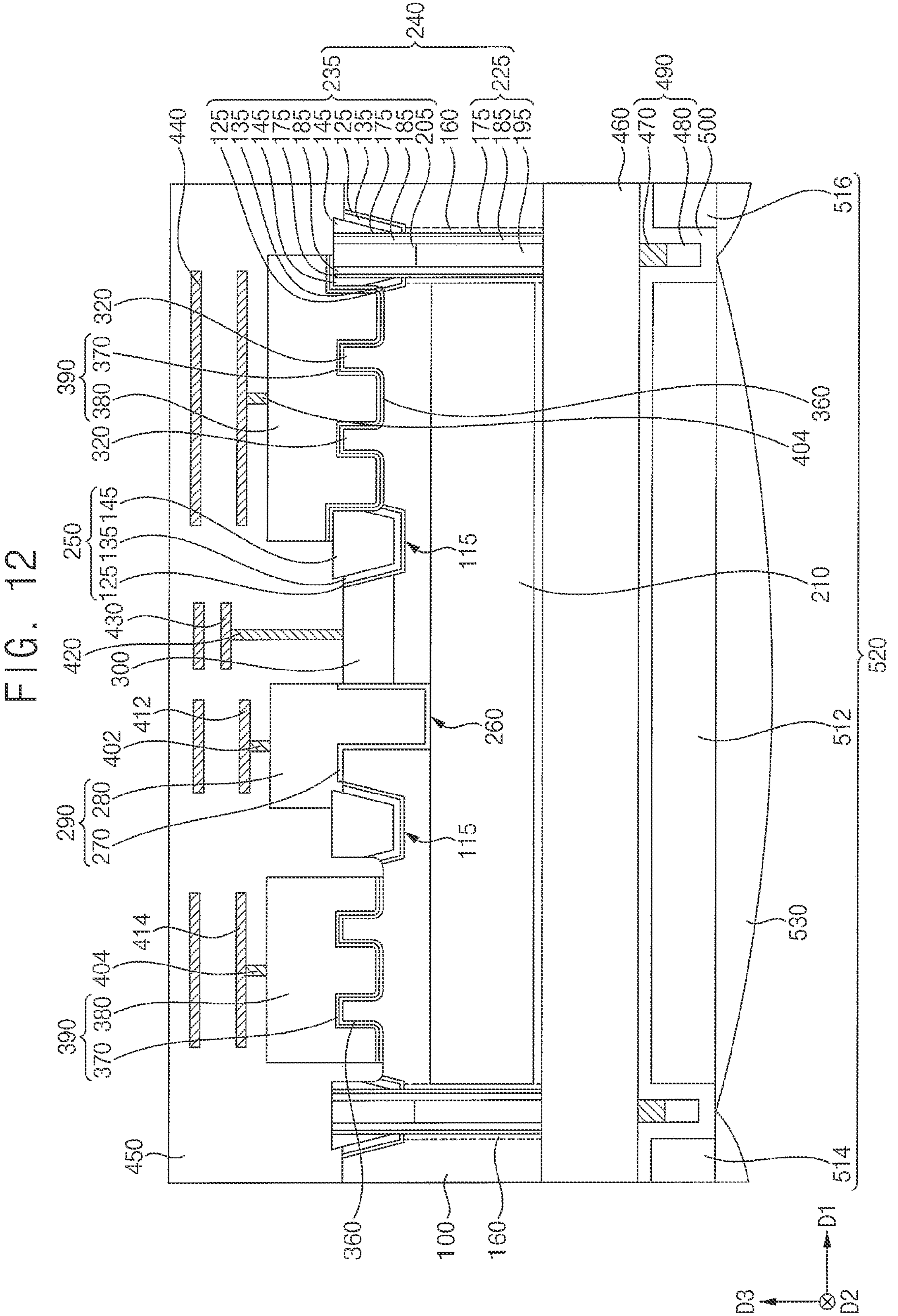
FIG. 12 illustrates a cross-sectional view of a pixel included in an image sensor in accordance with embodiments of the inventive concepts.
Figure 13:
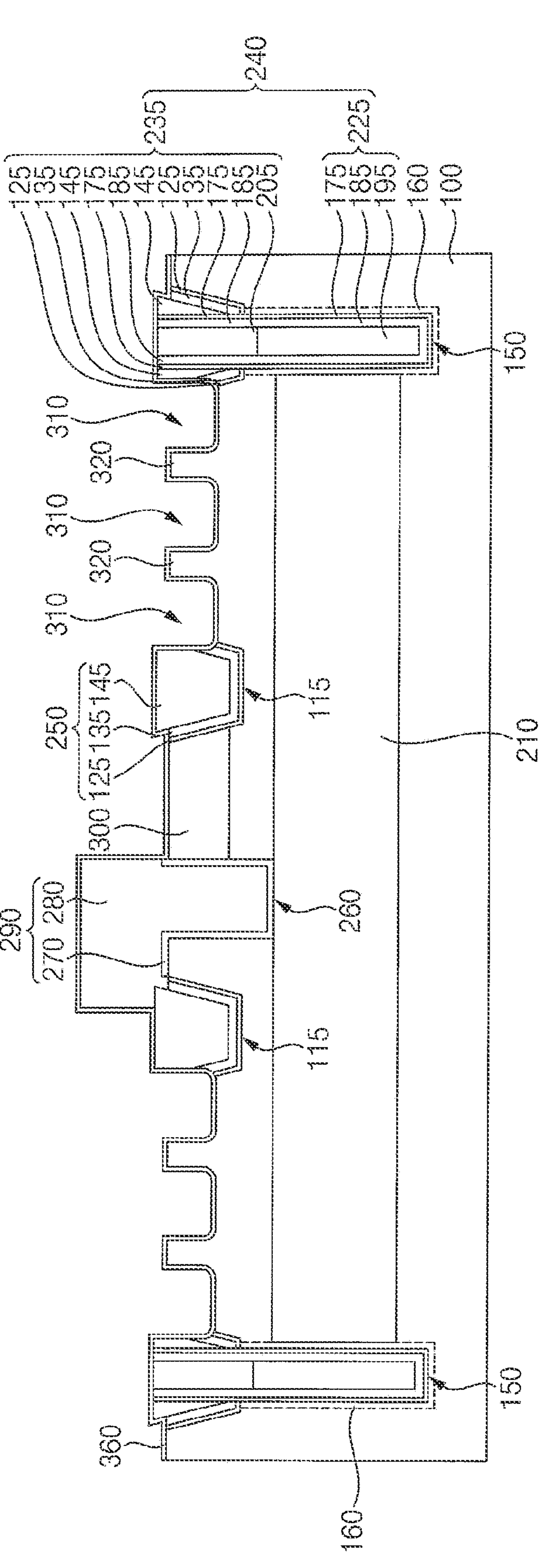
FIG. 13 illustrates a cross-sectional view of a method of manufacturing the image sensor shown in FIG. 12 in accordance with embodiments of the inventive concepts.

FIG. 12 illustrates a cross-sectional view of a pixel included in an image sensor in accordance with embodiments of the inventive concepts. FIG. 13 illustrates a cross-sectional view of a method of manufacturing the image sensor shown in FIG. 12.

The image sensor in FIG. 12 may be substantially the same as or similar to the image sensor illustrated with reference to FIG. 1, except for including a polysilicon layer doped with fluorine instead of including the silicon-fluorine layer. To avoid redundancy, description of features and processes of the embodiment of FIGS. 12 and 13 similar to the embodiment of FIGS. 1-11 may be omitted from the following.

Referring to FIG. 12, a polysilicon layer 360 doped with fluorine may be formed between the second gate structure 390 and the active pattern 320.

Referring to FIG. 13, after performing processes substantially the same as or similar to those illustrated with reference to FIGS. 2 to 7, instead of performing the ion implantation process illustrated with reference to FIG. 8, the polysilicon layer 360 doped with fluorine may be formed on the upper surface of the substrate 100. The polysilicon layer 360 doped with fluorine may be formed by performing a deposition process using fluorine source gas and silicon source gas. As the polysilicon layer 360 doped with fluorine is formed, the damaged surfaces of the active pattern 320 and the substrate 100 during the etching process for forming the fifth trench 310 may be cured.

Processes substantially the same as or similar to those illustrated with reference to FIG. 10 may be performed to form the second gate structure 390, and a portion of the polysilicon layer 360 doped with fluorine not covered by the second gate structure 390 may be removed.

Processes substantially the same as or similar to those illustrated with reference to FIG. 11 and FIG. 1 may be performed to manufacture the image sensor.

Figure 14:
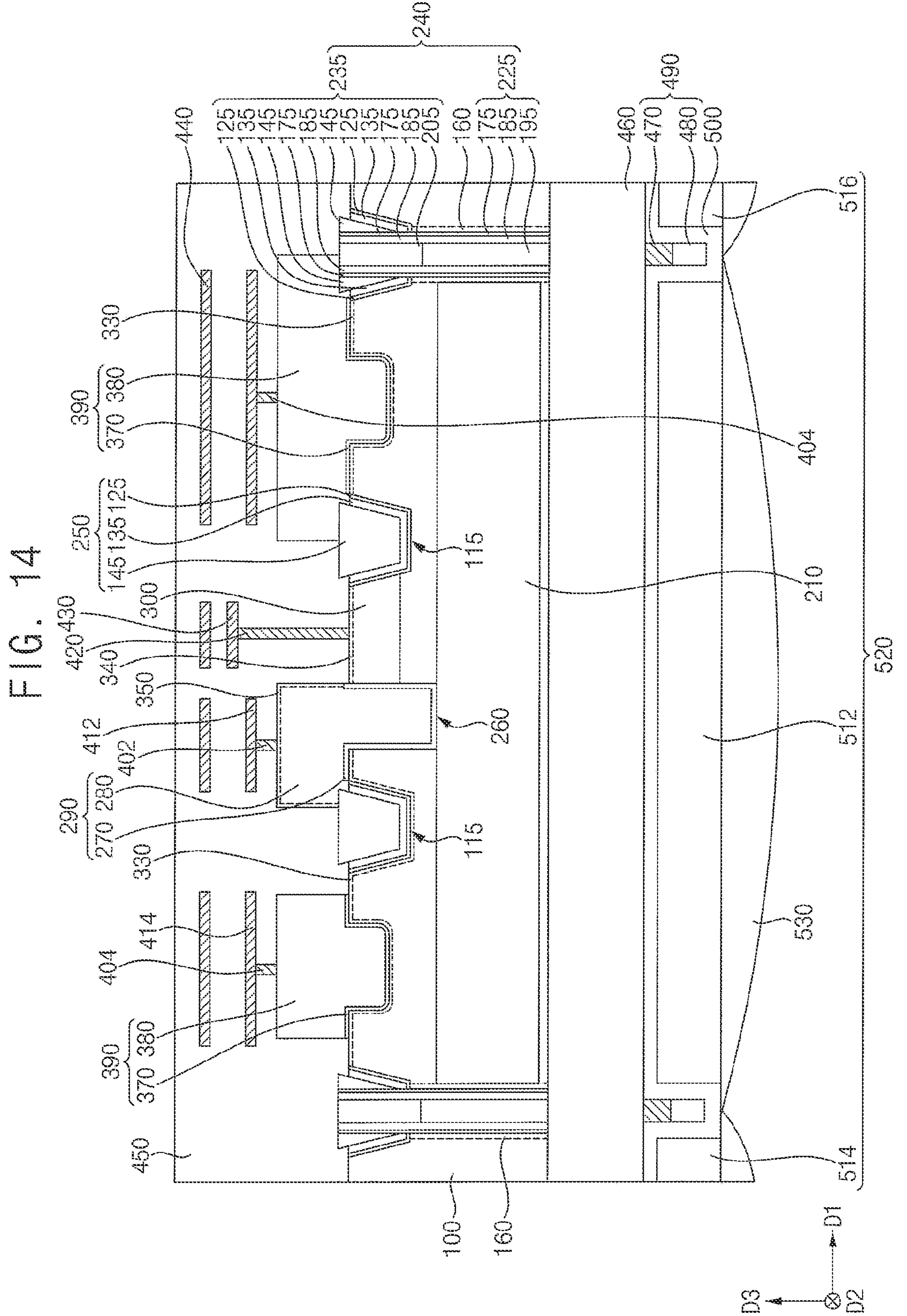
FIG. 14 illustrates a cross-sectional view of a pixel included in an image sensor in accordance with embodiments of the inventive concepts.
Figure 15:
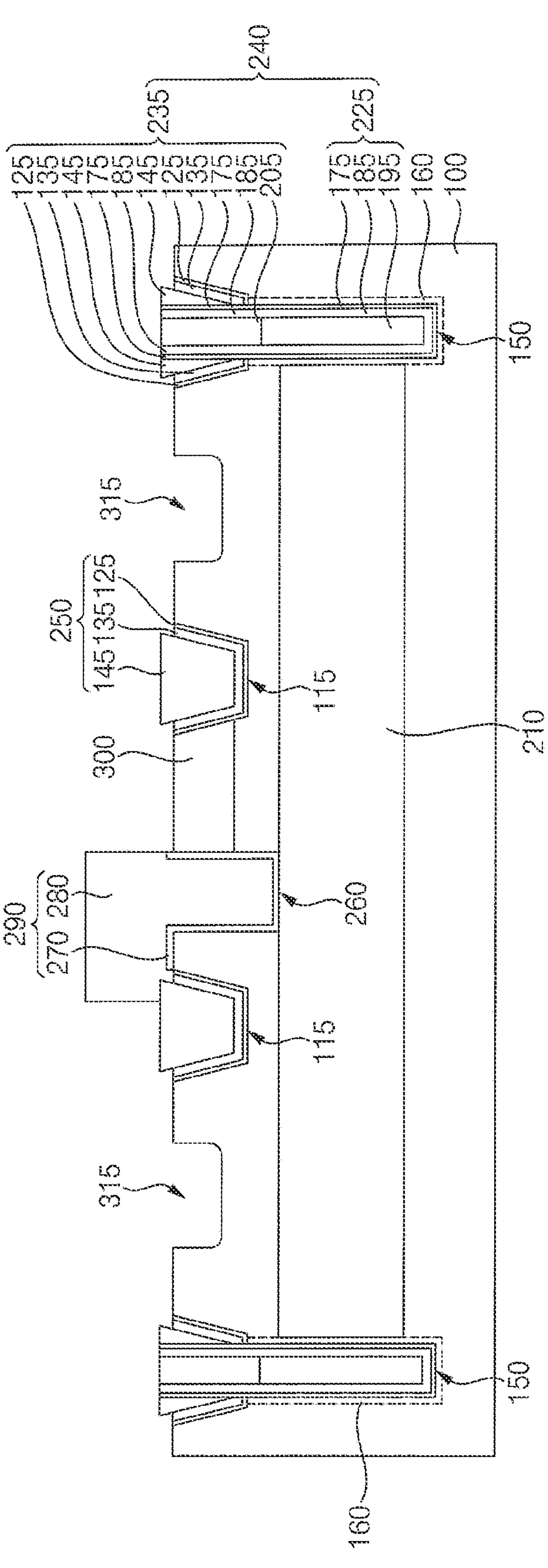
FIGS. 15 and 16 illustrate cross-sectional views of a method of manufacturing the image sensor of FIG. 14 in accordance with embodiments of the inventive concepts.
Figure 16:
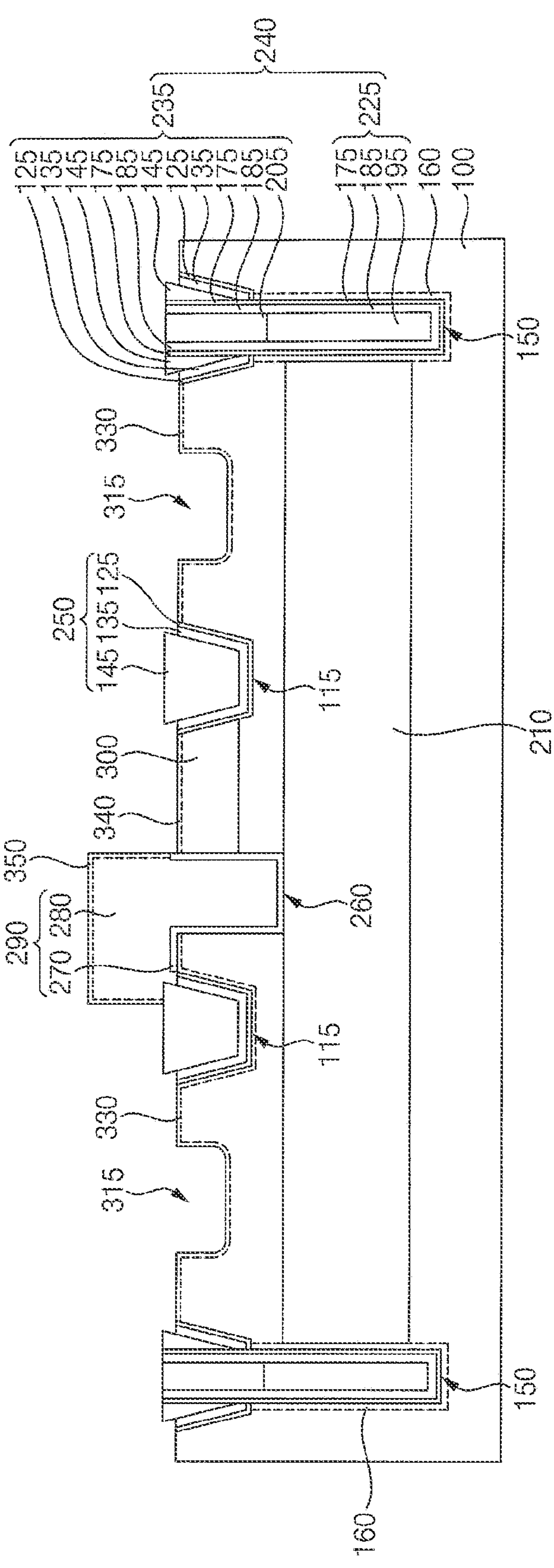

FIG. 14 illustrates a cross-sectional view of a pixel included in an image sensor in accordance with embodiments of the inventive concepts. FIGS. 15 and 16 illustrate cross-sectional views of a method of manufacturing the image sensor shown in FIG. 14.

The image sensor of FIG. 14 may be substantially the same as or similar to the image sensor illustrated with reference to FIG. 1, except for including a recessed channel array transistor (RCAT) instead of including the finFET. To avoid redundancy, description of features and processes of the embodiment of FIGS. 14-16 similar to the embodiment of FIGS. 1-11 may be omitted from the following.

Referring to FIG. 14, a recess may be formed on the substrate 100, and the second gate structure 390 may fill the recess.

Referring to FIG. 15, processes substantially the same as or similar to those illustrated with reference to FIGS. 2 to 6 may be performed, and the recess(es) may be formed on the substrate 100 instead of forming the fifth trench(es) 310 illustrated with reference to FIG. 7.

Referring to FIG. 16, processes substantially the same as or similar to those illustrated with reference to FIG. 8 may be performed to form the first silicon-fluorine layer 330, and processes substantially the same as or similar to those illustrated with reference to FIGS. 8 to 11 and FIG. 1 may be performed to complete the fabrication of the image sensor.

FIG. 14 shows that the second gate structure 390 not only fills the recess but also protrudes from the upper surface of the substrate 100. However, the inventive concepts are not limited thereto, and the second gate structure 390 may be formed only in the recess without protruding from the upper surface of the substrate 100.

Figure 17:
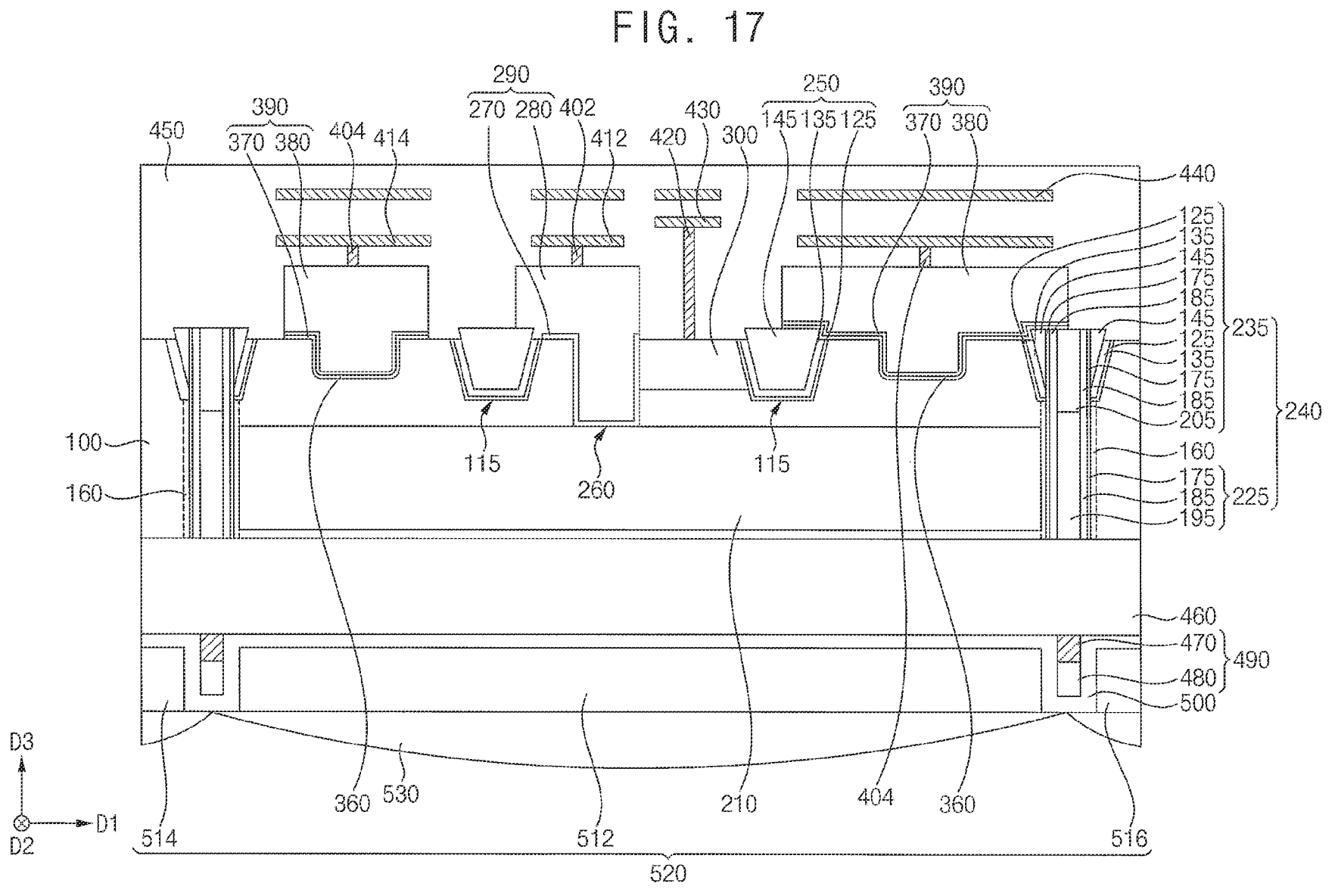
Figure 18:
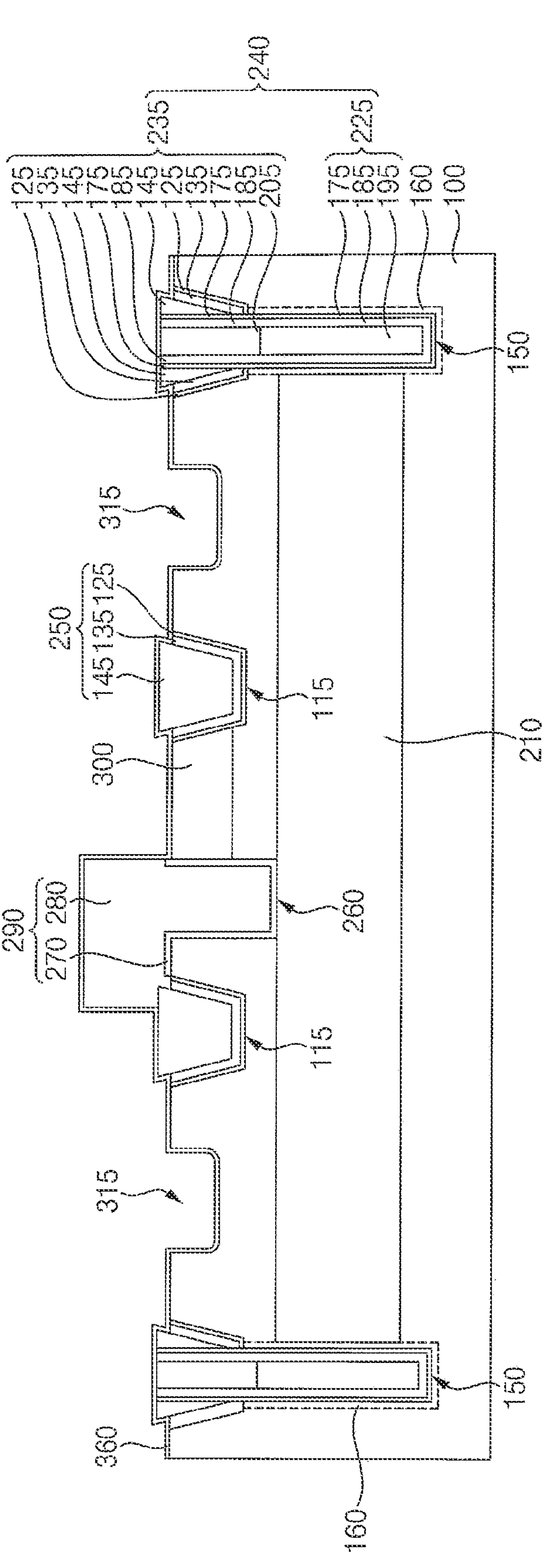
FIG. 18 illustrates a cross-sectional view of a method of manufacturing the image sensor of FIG. 17 in accordance with embodiments of the inventive concepts.

FIG. 17 illustrates a cross-sectional view of a pixel included in an image sensor in accordance with embodiments of the inventive concepts. FIG. 18 illustrates a cross-sectional view of a method of manufacturing the image sensor shown in FIG. 17.

The image sensor in FIG. 17 may be substantially the same as or similar to the image sensor illustrated with reference to FIG. 14, except for including a polysilicon layer doped with fluorine instead of including the silicon-fluorine layer. To avoid redundancy, description of features and processes of the embodiment of FIGS. 17 and 18 similar to the embodiment of FIGS. 14-16 may be omitted from the following.

Referring to FIG. 17, the polysilicon layer 360 doped with fluorine may be formed between the second gate structure 390 and the active pattern 320.

Referring to FIG. 18, after performing processes substantially the same as or similar to those illustrated with reference to FIG. 15, the polysilicon layer 360 doped with fluorine may be formed on the substrate 100.

Processes substantially the same as or similar to those illustrated with reference to FIGS. 16 and 14 may be performed to complete the fabrication of the image sensor.

Figure 19:
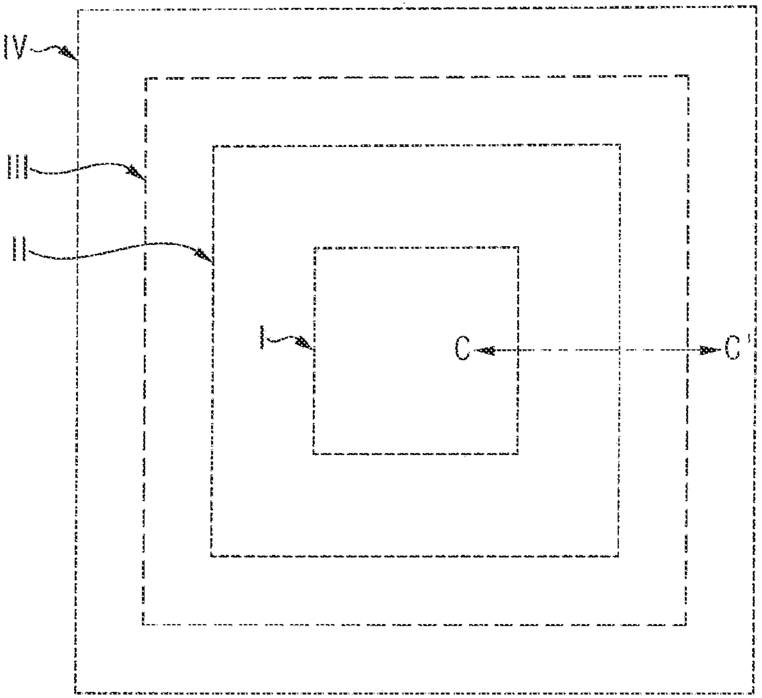
FIG. 19 illustrates a plan view of an image sensor in accordance with embodiments of the inventive concepts.
Figure 19:
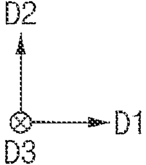
Figure 20:
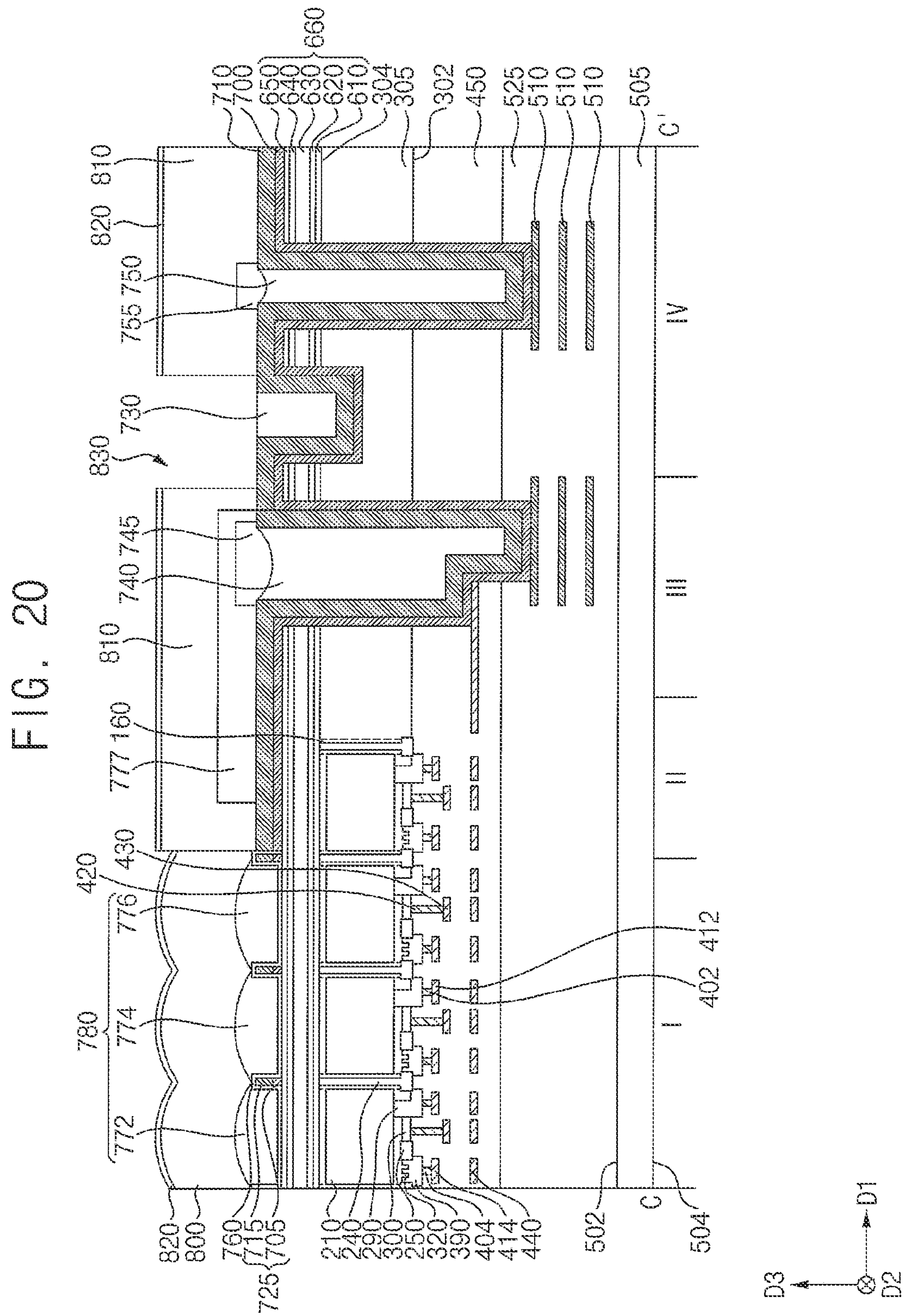
FIG. 20 illustrates a cross-sectional view taken along line C-C' of FIG. 19.

FIG. 19 illustrates a plan view of an image sensor in accordance with embodiments of the inventive concepts. FIG. 20 illustrates a cross-sectional view taken along line C-C' of the image sensor of FIG. 19 and is explanatory of a method of manufacturing the image sensor.

This image sensor of FIGS. 19 and 20 may include a pixel substantially the same as or similar to the pixel illustrated with reference to FIG. 1, and thus repeated explanations thereof may hereinafter be omitted. However, the pixel of FIG. 20 is overturned (i.e., flipped over) as compared to the pixel of FIG. 1. That is, in FIG. 20 the surface of the structure including the color filter array layer 780 is shown at the top, in contrast to FIG. 1 where the surface of the structure including the color filter layer 520 is shown at the bottom.

Hereinafter, two directions substantially parallel to a first surface 302 of a first substrate 305 may be defined as first and second directions D1 and D2, respectively, and a direction substantially perpendicular to the first surface 302 of the first substrate 305 may be defined as a third direction D3. In example embodiments, the first and second directions D1 and D2 may be substantially perpendicular to each other.

Referring to FIGS. 19 and 20, the image sensor may further include a second substrate 505, a second insulating interlayer 525, a first insulating interlayer 450, the first substrate 305 and a lower planarization layer 660 sequentially stacked in the third direction D3 in first to fourth regions I, II, III and IV. A color filter array layer 780, a microlens 800 and a transparent protection layer 820 may be sequentially stacked on the lower planarization layer 660 in the first region I, and a barrier pattern 700 and a conductive pattern 710 may be sequentially stacked on the lower planarization layer 660 in the second, third and fourth regions II, III and IV. A light blocking color filter layer 777 may be formed on the conductive pattern 710, an upper planarization layer 810 may be formed on the conductive pattern 710 to cover the light blocking color filter layer 777, and the transparent protection layer 820 may be formed on the upper planarization layer 810. The upper planarization layer 810 and the transparent protection layer 820 may be sequentially stacked over the lower planarization layer 660 in the fourth region IV.

The image sensor may further include the first to fourth wirings 412, 414, 430 and 440 and the first to third vias 402, 404 and 420 contained in the first insulating interlayer 450, the pixel division structure 240 extending through the first substrate 305 in the third direction D3, the light sensing element 210 in each unit pixel region defined by the pixel division structure 240, the isolation structure 250 under the first substrate 305, the first gate structure 290 extending through a lower portion of the first substrate 305 and having a lower portion protruding from the first surface 302 of the first substrate 305 and covered by the first insulating interlayer 450, the FD region 300 at a lower portion of the first substrate 305 adjacent to the first gate structure 290, the active fin 320 protruding from the first surface 302 of the first substrate 305 downwardly, the second gate structure 390 under the active fin 320, and the first silicon-fluorine layer 330 (refer to FIG. 1) on the active fin 320 on the second gate structure 390 in the first and second regions I and II.

The image sensor may further include an interference blocking structure 725 between color filters 772, 774 and 776 included in the color filter array layer 780 and a protection layer 760 covering the surface of the interference blocking structure 725 on the lower planarization layer 660 in the first region I.

The image sensor may further include a fifth wiring 510 contained in a second insulating interlayer 525 and a first through via structure extending through the lower planarization layer 660, the first substrate 305, the first insulating interlayer 450 and an upper portion of the second insulating interlayer 525 to commonly contact the fourth and fifth wirings 440 and 510 in the third region III.

The image sensor may further include may further include the fifth wiring 510 contained in the second insulating interlayer 525, a conductive pad 730 extending through the lower planarization layer 660 and an upper portion of the first substrate 305, and a second through via structure extending through the lower planarization layer 660, the first substrate 305, the first insulating interlayer 450 and an upper portion of the second insulating interlayer 525 to contact the fifth wiring 510.

In example embodiments, in plan view (See FIG. 19), the first region I may have a shape of a square or rectangle, the second region II may surround the first region I, the third region III may surround the second region II, and the fourth region IV may surround the third region III, however, the inventive concepts are not limited thereto.

In example embodiments, the first region I may be an active pixel region in which active pixels are formed, the second region II may be an OB (optically black) pixel region in which OB pixels are formed, the third region III may be a stack region in which the first through via structure is formed, and the fourth region IV may be a pad region in which the conductive pads 730 are formed.

The first substrate 305 may include the first surface 302 and a second surface 304 opposite to the first surface 302, and the second substrate 505 may include a third surface 502 and a fourth surface 504 opposite to the third surface 502. FIG. 20 shows that the first surface 302 is disposed under the second surface 304, and the third surface 502 is disposed over the fourth surface 504.

In example embodiments, p-type impurities may be doped into a portion or an entire portion of the first substrate 305 to form a p-type well.

The pixel division structure 240 may extend in the third direction D3 in the first and second regions I and II, and may have a lattice pattern arranged in the first and second directions D1 and D2 in a plan view. A plurality of unit pixel regions defined by the pixel division structure 240 may be arranged in the first and second directions D1 and D2.

In example embodiments, the light sensing element 210 may be a portion of the photodiode (PD). The light sensing element 210 may be formed in each of the unit pixel regions defined by the pixel division structure 240 in the first and second regions I and II, but however may not be formed in some of the unit pixel regions in the second region II.

The first gate structure 290 may include a buried portion extending from the first surface 302 of the first substrate 305 in the third direction D3 upwardly and a protrusion portion under the buried portion and having a bottom surface lower than the first surface 302 of the first substrate 305.

The FD region 300 may be formed at a portion of the first substrate 305 adjacent to the first surface 302 and the first gate structure 290, and may be doped with n-type impurities.

Each of the first and second insulating interlayers 450 and 525 may include an oxide, e.g., silicon oxide or a low-k dielectric material.

In example embodiments, the lower planarization layer 660 may include first, second, third, fourth and fifth layers 610, 620, 630, 640 and 650 sequentially stacked in the third direction D3. For example, the first to fifth layers 610, 620, 630, 640 and 650 may include aluminum oxide, hafnium oxide, silicon oxide, silicon nitride and hafnium oxide, respectively, although not limited thereto.

The interference blocking structure 725 may be formed on the lower planarization layer 660 to overlap the pixel division structure 240 in the third direction D3, and may have a lattice pattern in a plan view. In example embodiments, the interference blocking structure 725 may include first and second interference blocking patterns 705 and 715 stacked in the third direction D3.

The light blocking color filter layer 777 may include the same composition as a second color filter 774, which may absorb a light having a relatively large wavelength among a first color filter 772, the second color filter 724 and the third color filter 776 included in the color filter array layer 780.

The light blocking color filter layer 777 may be formed on the lower planarization layer 660 and the first through via structure in the second and third regions II and III, and may be spaced apart by a given distance in the horizontal direction from the first region I.

The first through via structure may include a fourth filling pattern 740 extending in the third direction D3 through the lower planarization layer 660, the first substrate 305, the first insulating interlayer 450 and an upper portion of the second insulating interlayer 525, a conductive pattern 710 covering a lower surface and a sidewall of the fourth filling pattern 740, a barrier pattern 700 covering a lower surface and a sidewall of the conductive pattern 710, and a first capping pattern 745 on an upper surface of the fourth filling pattern 740.

The second through via structure may include a fifth filling pattern 750 extending in the third direction D3 through the lower planarization layer 660, the first substrate 305, the first insulating interlayer 450 and an upper portion of the second insulating interlayer 525, the conductive pattern 710 covering a lower surface and a sidewall of the fifth filling pattern 750, the barrier pattern 700 covering the lower surface and the sidewall of the conductive pattern 710, and a second capping pattern 755 on an upper surface of the fifth filling pattern 750.

Each of the fourth and fifth filling patterns 740 and 750 may include, e.g., a low refractive index material (LRIM), and each of the first and second capping patterns 745 and 755 may include, e.g., a photoresist material.

A portion of the conductive pattern 710 included in the first through via structure may commonly contact the fourth and fifth wirings 440 and 510 so that the fourth and fifth wirings 440 and 510 may be electrically connected with each other, and a portion of the conductive pattern 710 included in the second through via structure may contact the fifth wiring 510 so as to be electrically connected thereto.

The conductive pattern 710 may be included in the first and second through via structures, and may also be formed on the lower planarization layer 660 in the second to fourth regions II, III and IV. A portion of the conductive pattern 710 in the second and third regions II and III may be referred to as a light blocking metal pattern.

The conductive pattern 710 may include a metal, e.g., tungsten, and the barrier pattern 700 may include a metal nitride, e.g., titanium nitride.

The conductive pad 730 may be electrically connected with an outer wiring, and may be a path through which electrical signals may be input into the active pixels and/or the OB pixels, or electrical signals may be output from the active pixels and/or the OB pixels. The conductive pad 730 may include a metal, e.g., aluminum. A lower surface and a sidewall of the conductive pad 730 may be covered by the conductive pattern 710.

The microlens 800 may be formed on the color filter array layer 780 and the protection layer 760 in the first region I, and the upper planarization layer 810 may be formed on the light blocking color filter layer 777 and the second through via structure in the second to fourth regions II, III and IV, however, the upper planarization layer 810 may include a third opening 830 exposing an upper surface of the conductive pad 730 in the fourth region IV. In example embodiments, the microlens 800 and the upper planarization layer 810 may include substantially the same material, e.g., a photoresist material having a high transmittance.

The transparent protection layer 820 may be formed on the microlens 800 and the upper planarization layer 810. The transparent protection layer 820 may include, e.g., SiO, SiOC, SiC, SiCN, etc.

The image sensor may include the finFET and the first silicon-fluorine layer 330 (e.g., see FIG. 1) on the surface of the active pattern 320 on which the finFET is formed, and thus may have improved electrical characteristics.

FIGS. 21 to 27 illustrate cross-sectional views of a method of manufacturing an image sensor shown in FIG. 20 in accordance with embodiments of the inventive concepts. This method may include processes substantially the same as or similar to those illustrated with reference to FIGS. 2 to 11, and thus repeated explanations thereof may be omitted to avoid redundancy.

Figure 21:
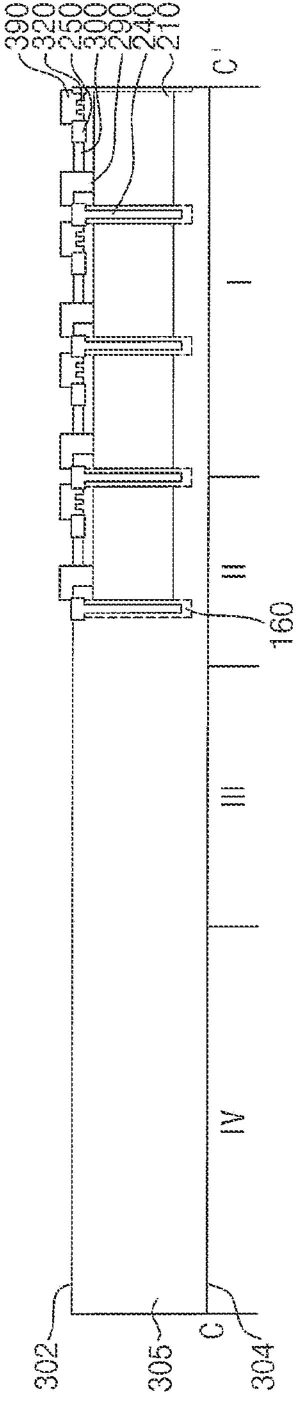
FIGS. 21, 22, 23, 24, 25, 26 and 27 illustrate cross-sectional views of a method of manufacturing an image sensor shown in FIGS. 19 and 20 in accordance with embodiments of the inventive concepts.
Figure 21:
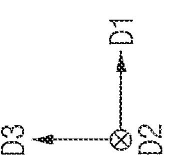

Referring to FIG. 21, processes substantially the same as or similar to those illustrated with reference to FIGS. 2 to 10 may be performed so that the pixel division structure 240, the isolation structure 250, the impurity region 160 and the light sensing element 210 may be formed in the first substrate 305 including the first to fourth regions I, II, III and IV, the first gate structure 290 and the FD region 300 may be formed, and the active pattern 320 and the second gate structure 390 may be formed. The first and second surfaces 302 and 304 of the first substrate 305 are shown.

Figure 22:
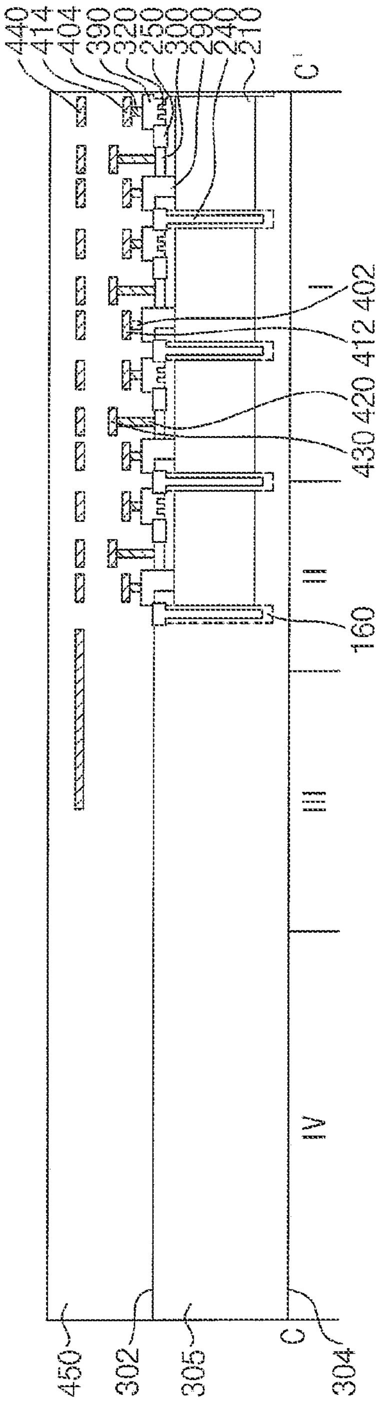
Figure 22:
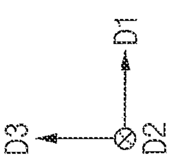

Referring to FIG. 22, processes substantially the same as or similar to those illustrated with reference to FIG. 11 may be performed so that the first insulating interlayer 450 containing the first to third vias 402, 404 and 420 and the first to fourth wirings 412, 414, 430 and 440 may be formed on the first surface 302 of the first substrate 305.

Figure 23:
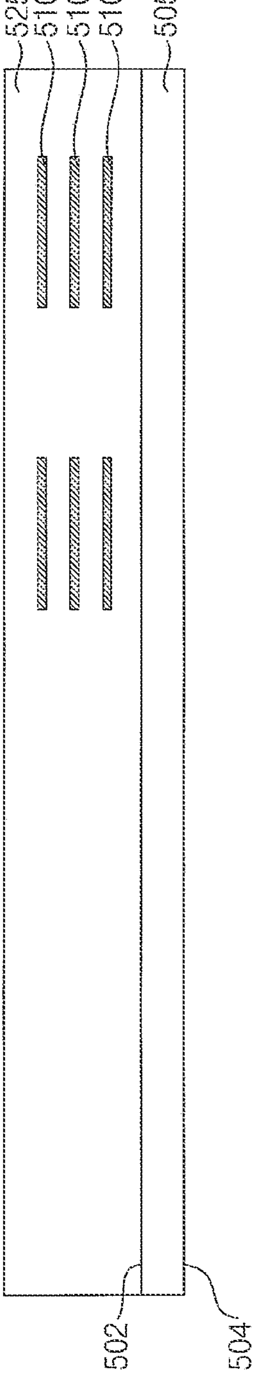

Referring to FIG. 23, a second insulating interlayer 525 containing a fifth wiring 510 and third vias connected thereto may be formed on a third surface 502 of a second substrate 505 including the third surface 502 and a fourth surface 504 opposite to each other.

FIG. 23 shows that the fifth wiring 510 is formed at three levels, however, the inventive concept may not be limited thereto.

Figure 24:
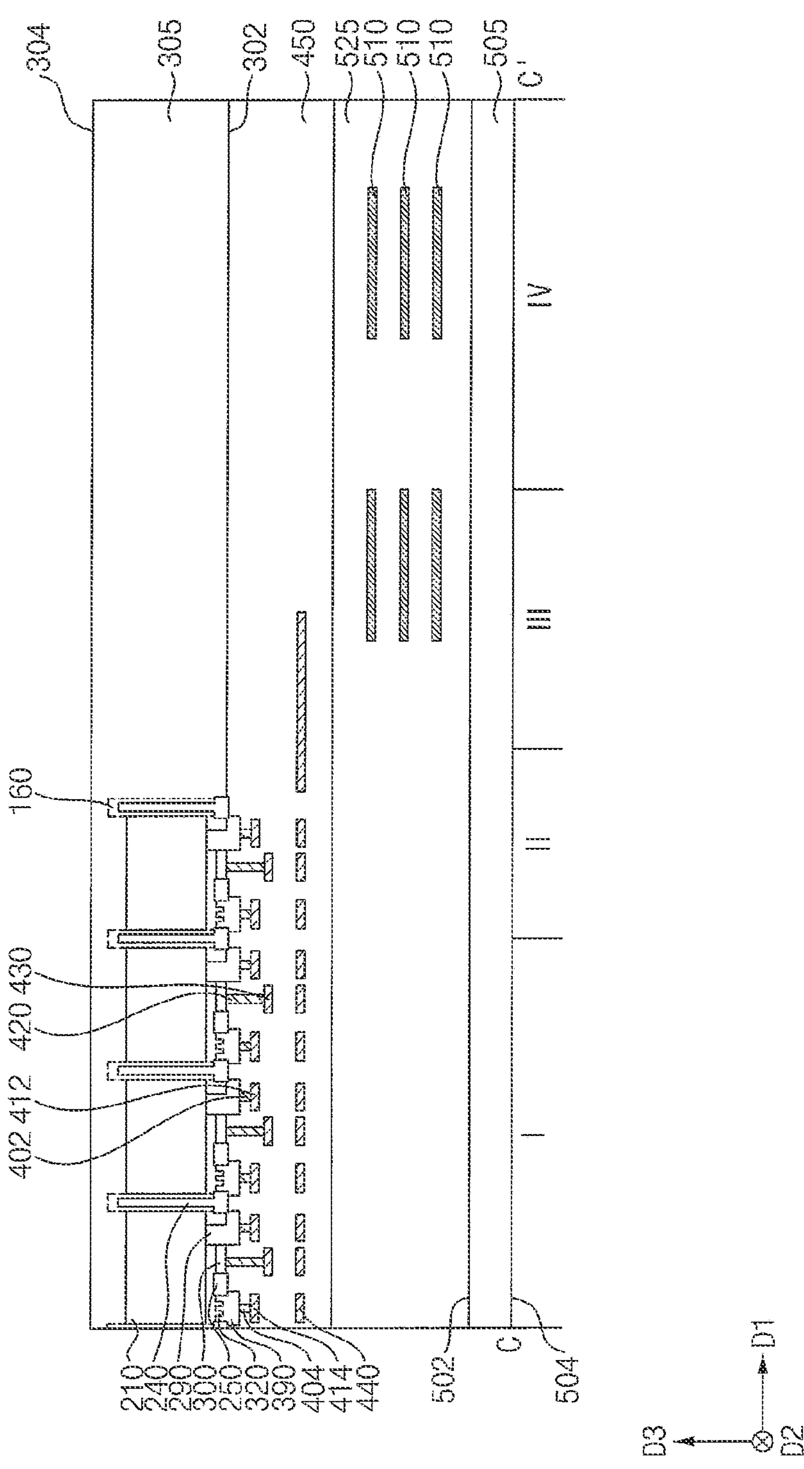

Referring to FIG. 24, the first insulating interlayer 450 on the first substrate 305 and the second insulating interlayer 525 on the second substrate 505 may be bonded with each other.

In example embodiments, the first and second insulating interlayers 450 and 525 may be bonded with each other through a bonding layer. Alternatively, the first and second insulating interlayers 450 and 525 may be bonded with each other with no bonding layer. After bonding the first and second insulating interlayers 450 and 525, the bonded structure may be overturned so that the second surface 304 of the first substrate 305 may face upwardly.

As the first and second substrates 305 and 505 are bonded with each other, the fifth wirings 510 on the second substrate 505 may be disposed in the third and fourth regions III and IV.

Figure 25:
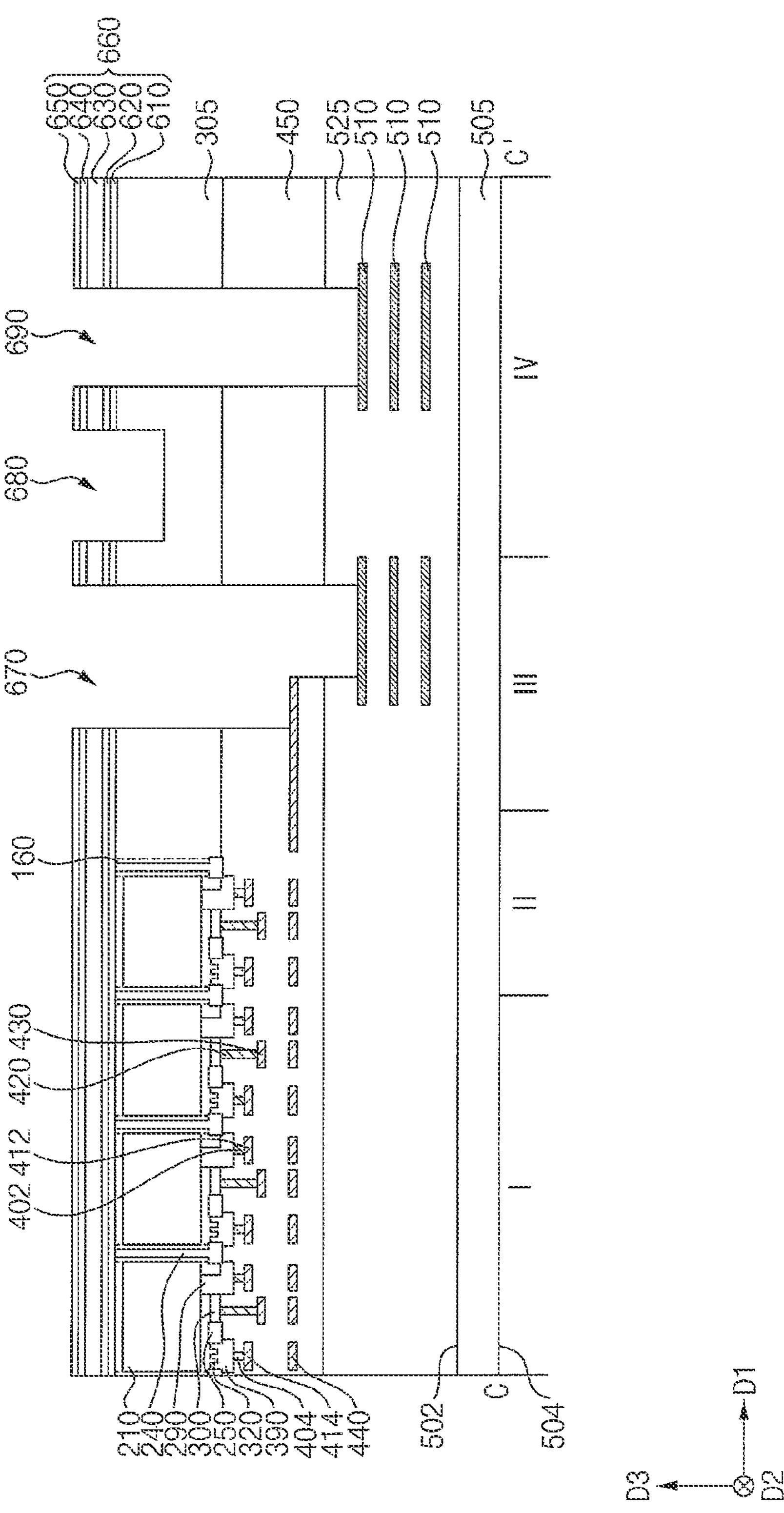

Referring to FIG. 25, a portion of the first substrate 305 adjacent to the second surface 304 may be removed.

In example embodiments, the portion of the first substrate 305 adjacent to the second surface 304 may be removed by a polishing process, e.g., a grinding process. Thus, the second filling pattern structure 225 included in the pixel division structure 240 (e.g., see FIG. 1) may be partially removed, and the pixel division structure 240 may extend through the first substrate 305.

A lower planarization layer 660 may be formed on the second surface 304 of the first substrate 305.

In an example embodiment, the lower planarization layer 660 may include first to fifth layers 610, 620, 630, 640 and 650 sequentially stacked in the third direction D3.

The lower planarization layer 660, the first substrate 305, the first insulating interlayer 450 and an upper portion of the second insulating interlayer 525 in the third region III may be partially removed to form a first opening 670. The lower planarization layer 660 and an upper portion of the first substrate 305 in the fourth region IV may be removed to form a sixth trench 680. The lower planarization layer 660, the first substrate 305, the first insulating interlayer 450 and an upper portion of the second insulating interlayer 525 in the fourth region IV may be removed to form a second opening 690.

The first opening 670 may expose the fourth wiring 440 in the first insulating interlayer 450 and the fifth wiring 510 in the second insulating interlayer 525, and the second opening 690 may expose the fifth wiring 510 in the second insulating interlayer 525.

Figure 26:
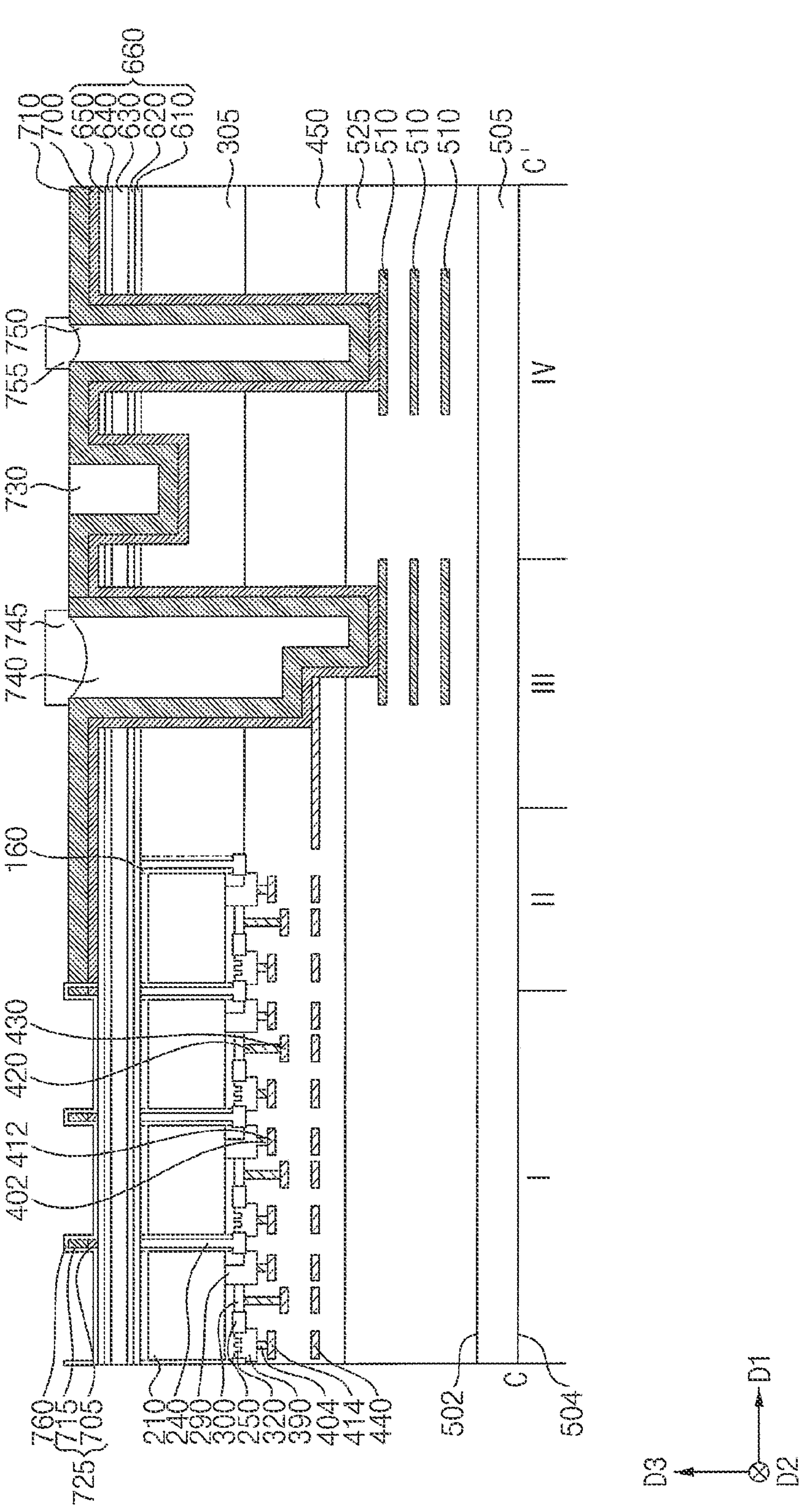

Referring to FIG. 26, a barrier layer and a first conductive layer may be sequentially formed on bottoms and sides of the first and second openings 670 and 690 and the sixth trench 680, and on an upper surface of the lower planarization layer 660. A second conductive layer may be formed on the first conductive layer to fill the sixth trench 680, and a planarization process may be performed so that an upper portion of the second conductive layer may be exposed and until an upper surface of the first conductive layer is exposed.

Thus, a conductive pad 730 may be formed on the first conductive layer in the sixth trench 680 in the fourth region IV.

The planarization process may be performed by, e.g., a chemical mechanical polishing (CMP) process and/or an etch back process.

A fourth filling layer may be formed on the first conductive layer and the conductive pad 730 to fill the first and second openings 670 and 690, and an upper portion of the fourth filling layer may be planarized until an upper surface of the first conductive layer is exposed.

An additional etching process may be performed on the fourth filling layer so that a fourth filling pattern 740 may be formed on the first conductive layer in the first opening 670 in the third region III, and a fifth filling pattern 750 may be formed on the first conductive layer in the second opening 690 in the fourth region IV.

A capping layer may be formed on the fourth and fifth filling patterns 740 and 750 and the conductive pad 730 and patterned to form first and second capping patterns 745 and 755 on the fourth and fifth filling patterns 740 and 750, respectively.

Portions of the barrier layer and the first conductive layer in the first region I may be patterned to form first interference blocking pattern 705 and a second interference blocking pattern 715, respectively, and portions of the barrier layer and the first conductive layer in the second region II may remain as a barrier pattern 700 and a conductive pattern 710, respectively. The first and second interference blocking patterns 705 and 715 may form an interference blocking structure 725.

An upper surface of the lower planarization layer 660 in the first region I may be partially exposed.

Portions of the barrier pattern 700, the conductive pattern 710, the fourth filling pattern 740 and the first capping pattern 745 in the first opening 670 in the third region III may form a first through via structure, and portions of the barrier pattern 700, the conductive pattern 710, the fifth filling pattern 750 and the second capping pattern 755 in the second opening 690 in the fourth region IV may form a second through via structure.

A protection layer 760 may be formed on the lower planarization layer 660 and the interference blocking structure 725 in the first region I.

Figure 27:
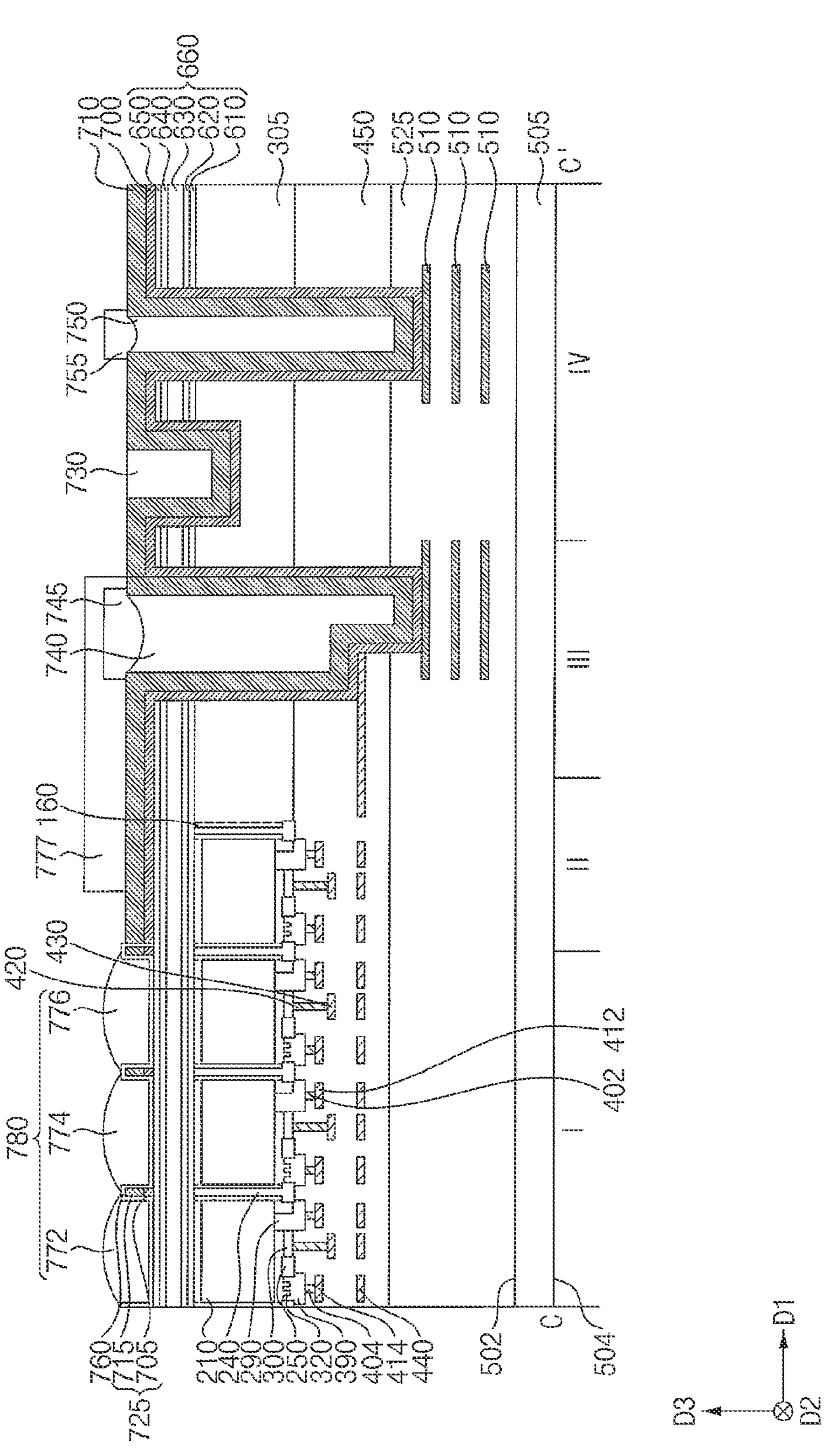

Referring to FIG. 27, a color filter array layer 780 including a first color filter 772, a second color filter 774 and a third color filter 776 may be formed on the protection layer 760 in the first region I, and a light blocking color filter layer 777 may be formed on the conductive pattern 710 and the first through via structure in the second and third regions II and III.

In example embodiments, each of the first color filter 772, the second color filter 774 and the third color filter 776 may be formed by depositing a color filter layer on the protection layer 760, the conductive pattern 710, the first and second capping patterns 745 and 755 and the conductive pad 730, e.g., through a spin coating process, and performing an exposure process and a developing process on the color filter layer.

The light blocking color filter layer 777 may be formed together with some of the color filters included in the color filter array layer 780, e.g., the second color filter 774.

In example embodiments, the first color filter 772, the second color filter 774 and the third color filter 776 may be a green filter G, a blue filter B and a red filter R, respectively. However, the inventive concepts are not limited thereto.

Referring to FIGS. 19 and 20 again, an upper planarization layer 810 may be formed on the color filter array layer 780, the protection layer 760, the light blocking color filter layer 777, the conductive pad 730 and the second capping pattern 755 in the first to fourth regions I, II, III and IV, and a patterning process and a reflow process may be performed on the upper planarization layer 810 in the first region Ito form a microlens 800.

A transparent protection layer 820 may be formed on the microlens 800 and the upper planarization layer 810, and a portion of the transparent protection layer 810 overlapping the conductive pad 730 in the third direction D3 in the fourth region IV and a portion of the upper planarization layer 810 thereunder may be removed to form a third opening 830 exposing an upper surface of the conductive pad 730.

An upper wiring (not shown) may be further formed to be electrically connected to the conductive pad 730 to complete the fabrication of the image sensor.

Although the inventive concepts have been described with reference to example embodiments, those skilled in the art will readily appreciate that many modifications are possible without materially departing from the novel teachings and advantages of the inventive concepts.

What is claimed is:

1. An image sensor comprising:

a pixel division structure extending through a substrate in a vertical direction perpendicular to an upper surface of the substrate, the pixel division structure defining unit pixel regions in which unit pixels are respectively formed;

a light sensing element in each of the unit pixel regions;

a transistor on the substrate;

a color filter array layer under the substrate, the color filter array layer including color filters; and a microlens under the color filter array layer, wherein the transistor comprises a gate structure on an active fin protruding from the upper surface of the substrate, and source/drain regions at portions of the active fin adjacent to the gate structure, and wherein the image sensor further comprises a silicon-fluorine layer at a portion of the active fin under the gate structure, or a polysilicon layer doped with fluorine between the gate structure and the active fin.

2. The image sensor of claim 1, wherein the image sensor comprises the silicon-fluorine layer at the portion of the active fin under the gate structure.

3. The image sensor of claim 2, wherein the gate structure comprises:

a gate insulation pattern on the silicon-fluorine layer; and a gate electrode on the gate insulation pattern.

4. The image sensor of claim 1, wherein the image sensor comprises the polysilicon layer doped with fluorine between the gate structure and the active fin.

5. The image sensor of claim 4, wherein the gate structure comprises:

a gate insulation pattern on the polysilicon layer doped with fluorine; and a gate electrode on the gate insulation pattern.

6. The image sensor of claim 1, wherein the gate structure is a first gate structure, and the image sensor further comprises:

a second gate structure contacting an upper surface of the light sensing element; and a floating diffusion (FD) region at an upper portion of the substrate and contacting the second gate structure, wherein the second gate structure, the light sensing element and the FD region configure a transfer transistor.

7. The image sensor of claim 1, wherein the transistor is one of a reset transistor, a source follower transistor and a select transistor.

8. The image sensor of claim 1, wherein the active fin is one of a plurality of active fins spaced apart from each other in a second direction parallel to the upper surface of the substrate, each of the plurality of active fins extending in a first direction parallel to the upper surface of the substrate and crossing the second direction, and wherein the gate structure extends in the second direction on ones of the plurality of active fins.

9. An image sensor comprising:

a pixel division structure extending through a substrate in a vertical direction perpendicular to an upper surface of the substrate, the pixel division structure defining unit pixel regions in which unit pixels are respectively formed;

a light sensing element in each of the unit pixel regions;

a transistor on the substrate;

a color filter array layer under the substrate, the color filter array layer including color filters; and a microlens under the color filter array layer, wherein the transistor comprises a gate structure on the substrate; and source/drain regions at portions of the substrate adjacent to the gate structure, and wherein a silicon-fluorine layer is formed at an upper portion of the substrate under the gate structure.

10. The image sensor of claim 9, wherein the gate structure comprises:

a gate insulation pattern on the silicon-fluorine layer; and a gate electrode on the gate insulation pattern.

11. The image sensor of claim 9, wherein the gate structure is a first gate structure, and the image sensor further comprises:

a second gate structure contacting an upper surface of the light sensing element; and a floating diffusion (FD) region at an upper portion of the substrate and contacting the second gate structure, and wherein the second gate structure, the light sensing element and the FD region configure a transfer transistor.

12. The image sensor of claim 9, wherein the transistor is one of a reset transistor, a source follower transistor and a select transistor.

13. The image sensor of claim 9, wherein an active fin is formed on the substrate, the active fin protruding from the upper surface of the substrate, and wherein the gate structure is formed on the active fin, and the source/drain regions are formed at portions of the active fin adjacent to the gate structure.

14. The image sensor of claim 13, wherein the active fin is one of a plurality of active fins spaced apart from each other in a second direction parallel to the upper surface of the substrate, each of the plurality of active fins extending in a first direction parallel to the upper surf ace of the substrate and crossing the second direction, and wherein the gate structure extends in the second direction on ones of the plurality of active fins.

15. An image sensor comprising:

a first substrate;

a first insulating interlayer on the first substrate, the first insulating interlayer containing first wirings;

a second insulating interlayer on the first insulating interlayer, the second insulating interlayer containing second wirings;

a second substrate on the second insulating interlayer;

a pixel division structure in the second substrate, the pixel division structure defining unit pixel regions in which unit pixels are respectively formed;

a light sensing element in each of the unit pixel regions of the second substrate;

a first gate structure extending through a lower portion of the second substrate and contacting the light sensing element;

a floating diffusion (FD) region at the lower portion of the second substrate adjacent to the first gate structure;

a second gate structure under an active fin, the active fin protruding from a lower surface of the second substrate downwardly;

a lower planarization layer on the second substrate;

a color filter array layer on the second substrate, the color filter array layer including color filters;

a microlens on the color filter array layer; and a silicon-fluorine layer at a portion of the active fin on the second gate structure; or a polysilicon layer doped with fluorine between the second gate structure and the active fin.

16. The image sensor of claim 15, wherein the first substrate defines a first region, a second region surrounding the first region, a third region surrounding the second region, and a fourth region surrounding the third region in an inner portion of the first substrate, an upper space over the first substrate, and a lower space under the first substrate, the pixel division structure is formed in the first and second regions, and the color filter array layer is formed in the first region.

17. The image sensor of claim 16, wherein the first and second wirings are formed in the third region, and wherein the image sensor further comprises:

a through via structure extending through the lower planarization layer, the second substrate, the second insulating interlayer and an upper portion of the first insulating interlayer and commonly contacting the first and second wirings in the third region; and a conductive pad extending through the lower planarization layer and an upper portion of the second substrate in the fourth region.

18. The image sensor of claim 15, wherein the image sensor comprises the silicon-fluorine layer at the portion of the active fin on the second gate structure.

19. The image sensor of claim 15, wherein the image sensor comprises the polysilicon layer doped with fluorine between the second gate structure and the active fin.

20. The image sensor of claim 15, further comprising source/drain regions at portions of the active fin adjacent to the second gate structure, wherein the second gate structure and the source/drain regions configure one of a reset transistor, a source follower transistor and a select transistor.

* * * * *